United States Patent
Miura et al.

(10) Patent No.: US 10,786,836 B2
(45) Date of Patent: Sep. 29, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventors: Atsuyasu Miura, Kyoto (JP); Kazuhiro Fujita, Kyoto (JP); Hiroki Tsujikawa, Kyoto (JP); Yuya Tsuchihashi, Kyoto (JP); Kenji Takemoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/656,441

(22) Filed: Jul. 21, 2017

(65) Prior Publication Data

US 2018/0029089 A1 Feb. 1, 2018

(30) Foreign Application Priority Data

Jul. 26, 2016 (JP) .................................. 2016-146521

(51) Int. Cl.
*B08B 3/08* (2006.01)
*B08B 3/14* (2006.01)
(Continued)

(52) U.S. Cl.
CPC .................. *B08B 3/14* (2013.01); *B08B 3/08* (2013.01); *H01L 21/02052* (2013.01);
(Continued)

(58) Field of Classification Search
CPC ......... H01L 21/67028; H01L 21/67051; H01L 21/68764; H01L 21/02052;
(Continued)

(56) References Cited

U.S. PATENT DOCUMENTS

| 2008/0053489 A1* | 3/2008 | Mizota ............. H01L 21/02052 134/33 |
| 2008/0142051 A1 | 6/2008 | Hashizume .................... 134/23 |

(Continued)

FOREIGN PATENT DOCUMENTS

| CN | 103907458 A | 7/2014 |
| JP | H11-087292 A | 3/1999 |

(Continued)

OTHER PUBLICATIONS

Translation of JP 2012-199295.*

*Primary Examiner* — Alexander Markoff
(74) *Attorney, Agent, or Firm* — Ostrolenk Faber LLP

(57) ABSTRACT

A substrate processing method includes a chemical liquid supplying step of supplying a chemical liquid to a substrate, an elapsed period measuring step of measuring an after-the-end elapsed period, a recovery step of controlling the switching unit to be in a recovery guiding state, when, at a start of the chemical liquid supplying step, the after-the-end elapsed period is less than a predetermined first period, and a draining step of controlling the switching unit to be in a drain guiding state, in which the liquid led to the recovery space is led to the drain line, when, at the start of the chemical liquid supplying step, the after-the-end elapsed period is not less than the predetermined first period and then switching to the recovery guiding state based on establishment of a predetermined draining ending condition.

10 Claims, 12 Drawing Sheets

(51) Int. Cl.
   *H01L 21/02* (2006.01)
   *H01L 21/67* (2006.01)
   *H01L 21/687* (2006.01)

(52) U.S. Cl.
   CPC .. *H01L 21/67028* (2013.01); *H01L 21/67051* (2013.01); *H01L 21/68764* (2013.01)

(58) Field of Classification Search
   CPC ......... H01L 21/67017; H01L 21/02307; H01L 21/02343; H01L 21/6704; H01L 21/6715; B08B 3/08; B08B 3/14
   See application file for complete search history.

(56) References Cited

U.S. PATENT DOCUMENTS

| | | | |
|---|---|---|---|
| 2010/0108096 A1 | 5/2010 | Minami et al. | 134/10 |
| 2010/0307533 A1* | 12/2010 | Sato | H01L 21/67057 134/10 |
| 2014/0230851 A1* | 8/2014 | Sato | H01L 21/67057 134/10 |
| 2015/0090301 A1* | 4/2015 | Higuchi | H01L 21/67028 134/23 |
| 2015/0328668 A1 | 11/2015 | Koyama et al. | |

FOREIGN PATENT DOCUMENTS

| | | |
|---|---|---|
| JP | 2006-024793 A | 1/2006 |
| JP | 2008-153521 A | 7/2008 |
| JP | 2009-231773 A | 10/2009 |
| JP | 2011-061034 A | 3/2011 |
| JP | 2012-199295 A | 10/2012 |
| JP | 2014-093362 A | 5/2014 |
| KR | 10-2009-0064430 A | 6/2009 |
| KR | 10-2010-0050402 A | 5/2010 |
| TW | 201606907 A | 2/2016 |

* cited by examiner

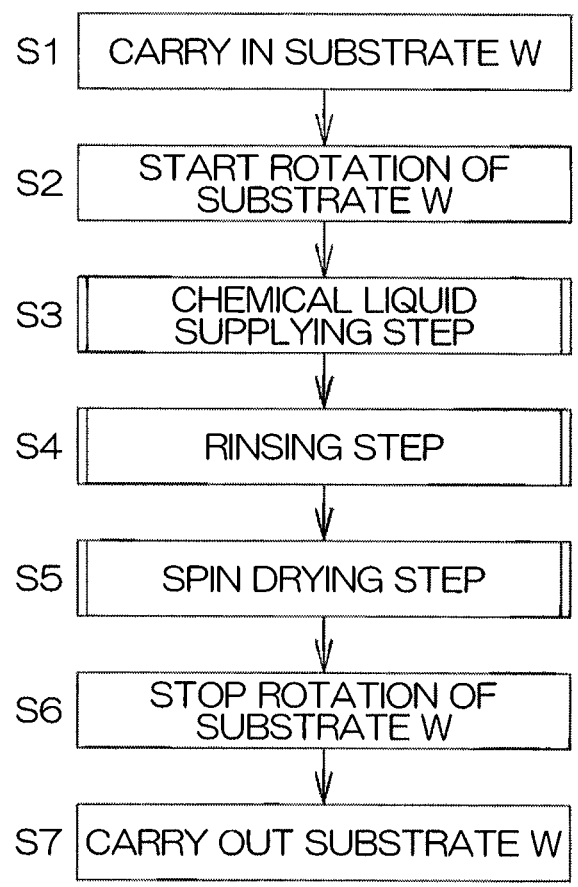

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus. Examples of substrates to be processed include semiconductor wafers, substrates for liquid crystal display devices, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

Japanese Patent Application Publication No. 2011-61034 discloses a single substrate processing type substrate processing apparatus that performs processing of one substrate at a time. A processing unit of the substrate processing apparatus includes a spin chuck, horizontally holding and rotating a substrate, a chemical liquid nozzle, discharging a chemical liquid toward an upper surface of the substrate held by the spin chuck, and a recovery cup of cylindrical shape that surrounds the spin chuck. A recovery space, to which the chemical liquid used in the processing of the substrate is led, is defined in the recovery cup.

Also, in order to achieve reduction of consumption amount of the chemical liquid, the processing unit is arranged to recover the chemical liquid after use in the processing of the substrate and enable reuse of the recovered chemical liquid in subsequent processing. Specifically, the substrate processing apparatus further includes a chemical liquid tank, storing the chemical liquid supplied to the chemical liquid nozzle, and a recovery line, leading the chemical liquid from the recovery space to the chemical liquid tank.

SUMMARY OF THE INVENTION

With the processing unit of the substrate processing apparatus, there is a case where chemical liquid processing is not performed over a long period (pause state). In this case, the chemical liquid remaining in the recovery space of the recovery cup may be altered due to the recovery space being left as it is over the long period after the last chemical liquid processing. In this case, when supplying of the chemical liquid from the chemical liquid nozzle to the substrate is restarted after the pause extending over the long period, the chemical liquid (hereinafter referred to as the "altered chemical liquid") that has become altered and remains in the recovery space becomes mixed in the chemical liquid flowing through the recovery space and the chemical liquid containing the altered chemical liquid may thereby be supplied to the chemical liquid tank and consequently, the chemical liquid containing the altered chemical liquid may be supplied to a substrate.

In order to prevent the chemical liquid containing the altered chemical liquid from being supplied to the substrate when the chemical liquid supplying is restarted after a pause extending over a long period, it may be considered to drain the chemical liquid, flowing through the recovery space, for a predetermined period.

In order to realize the above, it may be considered, specifically to arrange the processing unit to further include a drain line, arranged to drain (for example, discard) the liquid from the recovery space, and a switching unit, switching a flow destination of the liquid, flowing through the recovery space, between the recovery line and the drain line, and commanding, in a recipe in which processing conditions of the processing unit are set, to drain the liquid led to the recovery space when the chemical liquid supplying is restarted after a pause extending over a long period. When such a command is set in the recipe, the processing unit performs a draining operation such that the liquid led to the recovery space is led to the drain line.

However, due to such a draining operation being performed based on a command in the recipe, the draining operation is performed in the processings of all substrates of a single lot (of, for example, approximately 25 substrates) after the restart of chemical liquid supplying. Consequently, there is a problem in that the consumption amount of the chemical liquid increases.

Therefore, an object of the present invention is to provide a substrate processing method and a substrate processing apparatus, with which a substrate can be processed using a chemical liquid that does not contain an altered chemical liquid and further reduction of consumption amount of the chemical liquid can be achieved.

The present invention provides a substrate processing method that is a substrate processing method executed in a substrate processing apparatus including a recovery cup, having defined therein a recovery space to which a chemical liquid, used in processing of a substrate, is led, a recovery line, used to recover the chemical liquid led to the recovery space, a drain line, used to drain a liquid led to the recovery space, and a switching unit, switching the liquid, led to the recovery space, between the recovery line and the drain line, and includes a chemical liquid supplying step of supplying the chemical liquid to the substrate, an elapsed period measuring step of measuring an after-the-end elapsed period that is an elapsed period from an end of the last chemical liquid supplying step, a recovery step of controlling the switching unit to be in a recovery guiding state, in which the liquid led to the recovery space is led to the recovery line, when, at a start of the chemical liquid supplying step, the after-the-end elapsed period is less than a predetermined first period, and a draining step of controlling the switching unit to be in a drain guiding state, in which the liquid led to the recovery space is led to the drain line, when, at the start of the chemical liquid supplying step, the after-the-end elapsed period is not less than the predetermined first period and then switching to the recovery guiding state based on establishment of a predetermined draining ending condition.

With the present method, when, at the start of the chemical liquid supplying step, the after-the-end elapsed period, which is the elapsed period from the end of the last chemical liquid supplying step, is less than the first period, the switching unit is controlled to be in the recovery guiding state, and on the other hand, when the first period elapsed from the end of the last chemical liquid supplying step, the switching unit is controlled to be in the drain guiding state. When the chemical liquid supplying step is restarted after a pause state extending over a long period, the switching unit is controlled to be in the drain guiding state in the chemical liquid supplying step. Due to being left as it is over the long period after the end of the last chemical liquid supplying step, the chemical liquid remaining in the recovery space may be deteriorated. However, a guiding destination of the altered chemical liquid is set not to the recovery line but to the drain line when the chemical liquid supplying step is restarted following the pause state extending over the long period and therefore the altered chemical liquid can be prevented from becoming mixed in the chemical liquid led into the recovery line.

After the switching unit is controlled to be in the drain guiding state, the switching unit is switched to the recovery guiding state based on establishment of the predetermined draining ending condition. Thereafter, the switching unit is maintained in the recovery guiding state as long as the chemical liquid supplying continues to be performed at a processing interval less than the first period. Therefore, in restarting the chemical liquid supplying after a pause extending over a long period, the chemical liquid led into the recovery space is drained only in the processings of one or several substrates after the restart of chemical liquid supplying after the pause extending over the long period, and subsequently, the chemical liquid led into the recovery space is recovered and reused. Therefore, in comparison to a case where the chemical liquid led into the recovery space is drained in the processings of all substrates of one lot (of, for example, 25 substrates) after the restart of chemical liquid supplying, a recovery amount of the chemical liquid can be increased and further reduction of the consumption amount of the chemical liquid can thereby be achieved.

By the above, a substrate processing method, with which a substrate can be processed using a chemical liquid that does not contain an altered chemical liquid and further reduction of consumption amount of the chemical liquid can be achieved, can be provided.

In a preferred embodiment of the present invention, the substrate processing apparatus further includes a recipe storage portion, storing a chemical liquid supplying recipe that sets a condition of chemical liquid supplying in the chemical liquid supplying step, and the draining step includes a step, in which, even when it is commanded in the chemical liquid supplying recipe that the switching unit is to be controlled to be in the recovery guiding state, the command is ignored and the switching unit is controlled to be in the drain guiding state.

With the present method, at the start of the chemical liquid supplying step, even when it is commanded in the chemical liquid supplying recipe that the switching unit is to be controlled to be in the recovery guiding state, the command is ignored and the switching unit is controlled to be in the drain guiding state. The switching unit can thereby be switched satisfactorily between the recovery guiding state and the drain guiding state.

In a preferred embodiment of the present invention, the substrate processing apparatus further includes a recipe storage portion, storing a chemical liquid supplying recipe that sets a condition of chemical liquid supplying in the chemical liquid supplying step, and the recovery step may include a step of making a first chemical liquid supplying recipe, in which it is commanded that the switching unit is to be controlled to be in the recovery guiding state, be stored as the chemical liquid supplying recipe in the recipe storage portion. In this case, the draining step may include a step of making a second chemical liquid supplying recipe, in which it is commanded that the switching unit is to be controlled to be in the drain guiding state, be stored as the chemical liquid supplying recipe in the recipe storage portion.

With the present method, the switching unit is controlled to be in the recovery guiding state by making the first chemical liquid supplying recipe be stored in the recipe storage portion and the switching unit is controlled to be in the drain guiding state by making the second chemical liquid supplying recipe be stored in the recipe storage portion. The switching unit can thereby be switched satisfactorily between the recovery guiding state and the drain guiding state.

The draining ending condition may be that an accumulation of periods, in which the switching unit is controlled to be in the drain guiding state, reaches a predetermined second period.

With the present method, when the accumulation of periods, in which the switching unit is controlled to be in the drain guiding state, reaches the predetermined second period, the switching unit is switched to the recovery guiding state. The switching from the drain guiding state to the recovery guiding state of the switching unit can thereby be performed satisfactorily.

The draining step may be a step spanning across a plurality of chemical liquid supplying steps.

With the present method, the period, in which the switching unit is maintained in the drain guiding state, can be kept fixed regardless of the lengths of the periods of the chemical liquid supplying steps.

Also, the present invention provides a substrate processing apparatus including a chemical liquid supplying unit, supplying a chemical liquid to a substrate, a recovery cup, having defined therein a recovery space to which the chemical liquid used in processing the substrate is led, a recovery line, used to recover the chemical liquid led to the recovery space, a drain line, used to discard a liquid led to the recovery space, a switching unit, switching the liquid, led to the recovery space, between the recovery line and the drain line, an elapsed period measuring unit, measuring an after-the-end elapsed period, which is an elapsed period from an end of the last chemical liquid supplying step, and a controller, and where the controller executes a chemical liquid supplying step of controlling the chemical liquid supplying unit to supply the chemical liquid to the substrate, a recovery step of controlling the switching unit to realize a recovery guiding state, in which the liquid led to the recovery space is led to the recovery line, when, at a start of the chemical liquid supplying step, the after-the-end elapsed period is less than a predetermined first period, and a draining step of controlling the switching unit to realize a drain guiding state, in which the liquid led to the recovery space is led to the drain line, when, at the start of the chemical liquid supplying step, the after-the-end elapsed period is not less than the predetermined first period and then switching to the recovery guiding state based on establishment of a predetermined draining ending condition.

With the present arrangement, when, at the start of the chemical liquid supplying step, the after-the-end elapsed period, which is the elapsed period from the end of the last chemical liquid supplying step, is less than the first period, the switching unit is controlled to be in the recovery guiding state, and on the other hand, when the first period elapsed from the end of the last chemical liquid supplying step, the switching unit is controlled to be in the drain guiding state. When the chemical liquid supplying step is restarted after a pause state extending over a long period, the switching unit is controlled to be in the drain guiding state in the chemical liquid supplying step. Due to being left as it is over the long period after the end of the last chemical liquid supplying step, the chemical liquid remaining in the recovery space may be altered. However, the guiding destination of such an altered chemical liquid is set not to the recovery line but to the drain line and therefore, the altered chemical liquid can be prevented from becoming mixed in the chemical liquid led into the recovery line.

After the switching unit is controlled to be in the drain guiding state, the switching unit is switched to the recovery guiding state based on establishment of the predetermined draining ending condition. Thereafter, the switching unit is maintained in the recovery guiding state as long as the chemical liquid supplying continues to be performed at a processing interval less than the first period. Therefore, in restarting the chemical liquid supplying after a pause extending over a long period, the chemical liquid led into the recovery space is drained only in the processings of one or several substrates after the restart of chemical liquid supplying after the pause extending over the long period, and subsequently, the chemical liquid led into the recovery space is recovered and reused. Therefore, in comparison to a case where the chemical liquid led into the recovery space is drained in the processings of all substrates of one lot (of, for example, 25 substrates) after the restart of chemical liquid supplying, the recovery amount of the chemical liquid can be increased and further reduction of consumption amount of the chemical liquid can thereby be achieved.

By the above, a substrate processing apparatus, with which a substrate can be processed using a chemical liquid that does not contain an altered chemical liquid and further reduction of consumption amount of the chemical liquid can be achieved, can be provided.

In a preferred embodiment of the present invention, a recipe storage portion, storing a chemical liquid supplying recipe that sets a condition of chemical liquid supplying in the chemical liquid supplying step, is further included. In this case, the controller may execute, in the draining step, a step, in which, even when it is commanded in the chemical liquid supplying recipe that the switching unit is to be controlled to be in the recovery guiding state, the command is ignored and the switching unit is controlled to be in the drain guiding state.

With the present arrangement, at the start of the chemical liquid supplying step, even when it is commanded in the chemical liquid supplying recipe that the switching unit is to be controlled to be in the recovery guiding state, the command is ignored and the switching unit is controlled to be in the drain guiding state. The switching unit can thereby be switched satisfactorily between the recovery guiding state and the drain guiding state.

In a preferred embodiment of the present invention, a recipe storage portion, storing a chemical liquid supplying recipe that sets a condition of chemical liquid supplying in the chemical liquid supplying step, is further included. In this case, the controller may execute, in the recovery step, a step of making a first chemical liquid supplying recipe, in which it is commanded that the switching unit is to be controlled to be in the recovery guiding state, be stored as the chemical liquid supplying recipe in the recipe storage portion. Further, the controller may execute, in the draining step, a step of making a second chemical liquid supplying recipe, in which it is commanded that the switching unit is to be controlled to be in the drain guiding state, be stored as the chemical liquid supplying recipe in the recipe storage portion.

With the present arrangement, the switching unit is controlled to be in the recovery guiding state by making the first chemical liquid supplying recipe be stored in the recipe storage portion and the switching unit is controlled to be in the drain guiding state by making the second chemical liquid supplying recipe be stored in the recipe storage portion. The switching unit can thereby be switched satisfactorily between the recovery guiding state and the drain guiding state.

The draining ending condition may be that an accumulation of periods, in which the switching unit is controlled to be in the drain guiding state, reaches a predetermined second period.

With the present arrangement, when the accumulation of periods, in which the switching unit is controlled to be in the drain guiding state, reaches the predetermined second period, the switching unit is switched to the recovery guiding state. The switching from the drain guiding state to the recovery guiding state of the switching unit can thereby be performed satisfactorily.

The controller may be provided to be capable of executing the draining step across a plurality of chemical liquid supplying steps.

With the present arrangement, the period, in which the switching unit is maintained in the drain guiding state, can be kept fixed regardless of the lengths of the periods of the chemical liquid supplying steps.

The aforementioned as well as other objects, features, and effects of the present invention will be made clear by the following description of the preferred embodiments, with reference to the accompanying drawings.

BRIEF DESCRIPTION OF THE DRAWINGS

FIG. 5 is a flow diagram for describing an example of substrate processing performed by the processing unit.

DETAILED DESCRIPTION OF THE PREFERRED EMBODIMENT

Figure 1:
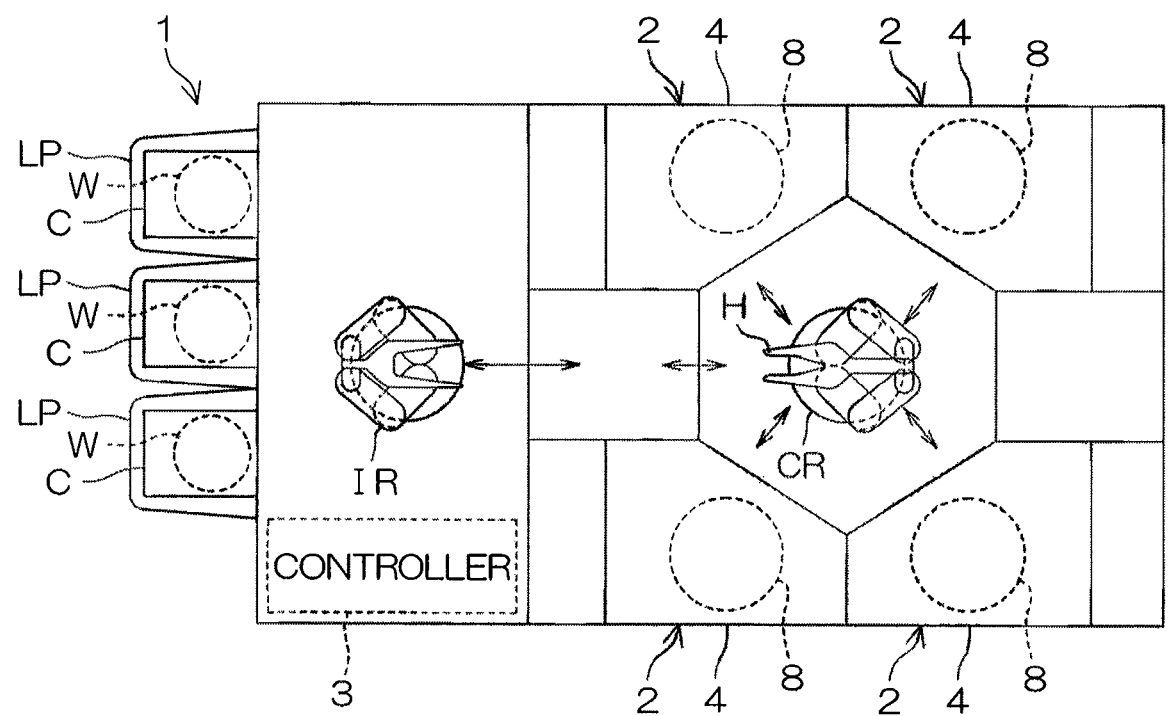
FIG. 1 is an illustrative plan view for describing a layout of an interior of a substrate processing apparatus according to a first preferred embodiment of the present invention.

FIG. 1 is an illustrative plan view for describing a layout of an interior of a substrate processing apparatus 1 according to a first preferred embodiment of the present invention. The substrate processing apparatus 1 is a single substrate processing type apparatus that processes disk-shaped substrates W, such as semiconductor wafers, etc., one at a time using a processing liquid or a processing gas. The substrate processing apparatus 1 includes a plurality of processing units 2, processing substrates W using a processing liquid, load ports LP, in each of which is mounted a carrier C that houses a plurality of substrates W to be processed by the processing units 2, transfer robots IR and CR, transporting the substrates W between the load ports LP and the processing units 2, and a controller 3, controlling the substrate processing apparatus 1. The transfer robot IR transports the substrates W between the carriers C and the substrate transfer robot CR. The substrate transfer robot CR transports the substrates W between the transfer robot IR and the processing units 2. The plurality of processing units 2 have, for example, the same arrangement.

Figure 2:
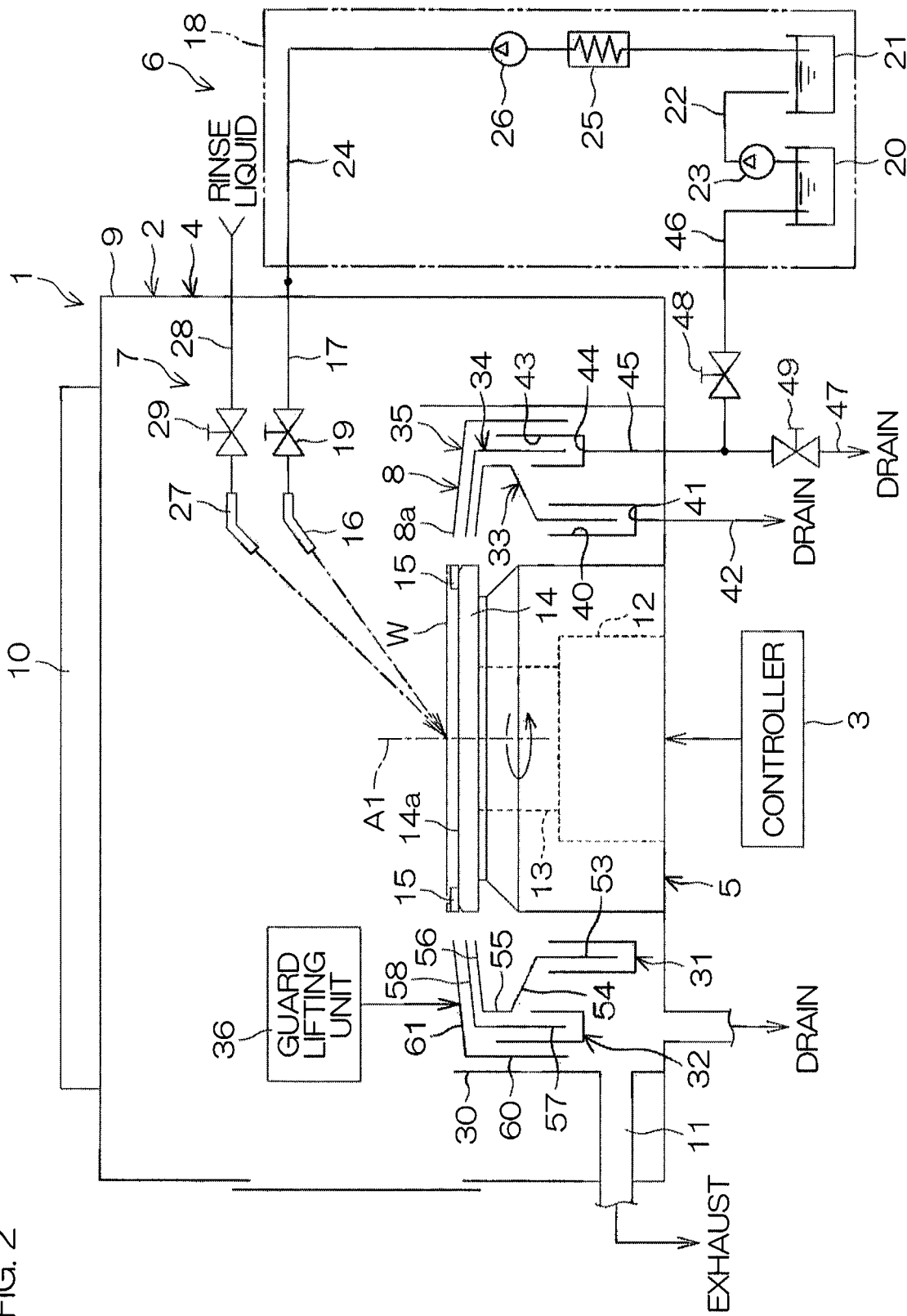
FIG. 2 is an illustrative sectional view for describing an arrangement example of a processing unit included in the substrate processing apparatus.
Figure 3A:
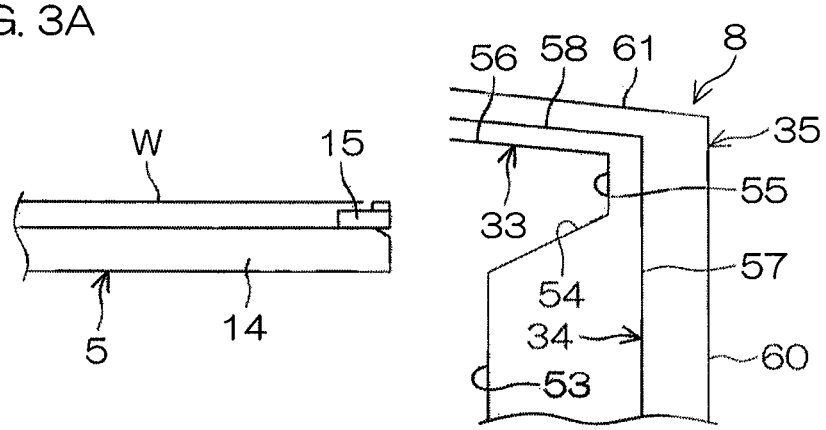
FIG. 3A to 3C are sectional views for describing changes of height positions of guards in the respective processings.
Figure 3B:
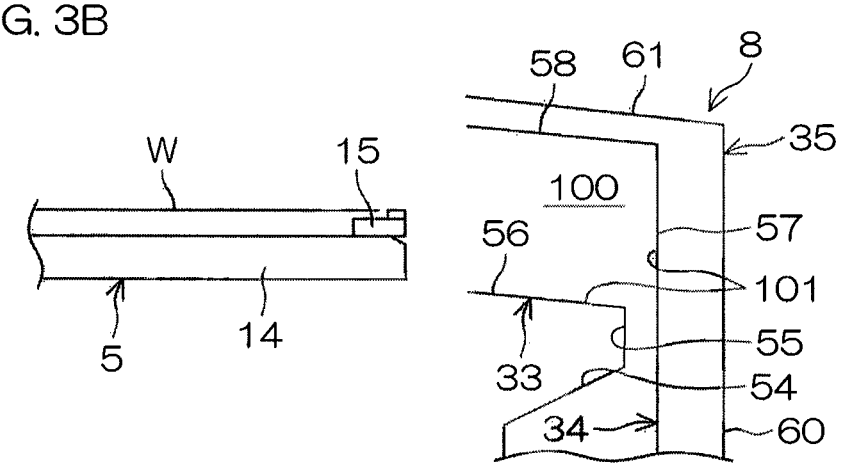
Figure 3C:
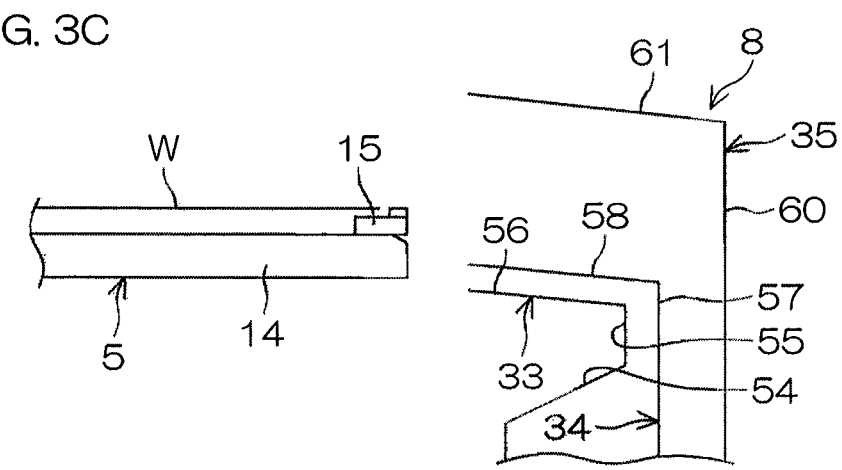

FIG. 2 is an illustrative sectional view for describing an arrangement example of a processing unit 2. FIG. 3A to 3C are sectional views for describing changes of height positions of guards 33 to 35 in the respective processings.

As shown in FIG. 2, the processing unit 2 includes a box-shaped chamber 4, having an internal space, a spin chuck 5, holding a single substrate W in a horizontal orientation inside the chamber 4 and rotating the substrate W around a vertical rotational axis A1 passing through a center of the substrate W, a chemical liquid supplying unit 6, arranged to supply a chemical liquid to an upper surface (front surface) of the substrate W held by the spin chuck 5, a rinse liquid supplying unit 7, arranged to supply a rinse liquid to an upper surface (front surface) of the substrate W held by the spin chuck 5, and a cylindrical processing cup (recovery cup) 8, surrounding the spin chuck 5.

As shown in FIG. 2, the chamber 4 includes a box-shaped partition wall 9, an FFU (fan filter unit) 10 as a blower unit feeding clean air from an upper portion of the partition wall 9 into an interior of the partition wall 9 (corresponding to an interior of the chamber 4), and an exhaust apparatus (not shown), exhausting gas inside the chamber 4 from a lower portion of the partition wall 9.

As shown in FIG. 2, the FFU 10 is disposed above the partition wall 9 and is mounted on a ceiling of the partition wall 9. The FFU 10 feeds the clean air into the chamber 4 from the ceiling of the partition wall 9. The exhaust apparatus (not shown) is connected via an exhaust duct 11 which is connected to an interior of the processing cup 8, to a bottom portion of the processing cup 8 and suctions the interior of the processing cup 8 from the bottom portion of the processing cup 8. A downward flow is formed inside the chamber 4 by the FFU 10 and the exhaust apparatus (not shown).

As shown in FIG. 2, as the spin chuck 5, a clamping type chuck, which clamps the substrate W in horizontal directions to hold the substrate W horizontally, is adopted. Specifically, the spin chuck 5 includes a spin motor 12, a spin shaft 13, made integral to a drive shaft of the spin motor 12, and a disk-shaped spin base 14, mounted substantially horizontally on an upper end of the spin shaft 13.

The spin base 14 includes a horizontal, circular upper surface 14a, having an outer diameter larger than an outer diameter of the substrate W. A plurality (not less than three; for example, six) of clamping members 15 are disposed at a peripheral edge portion of the upper surface 14a. At the upper surface peripheral edge portion of the spin base 14, the plurality of clamping members 15 are disposed at suitable intervals, for example, at equal intervals on a circumference corresponding to an outer peripheral shape of the substrate W.

Also, the spin chuck 5 is not restricted to a clamping type and, for example, a vacuum suction type arrangement (vacuum chuck) that vacuum-suctions a rear surface of the substrate W to hold the substrate W in a horizontal orientation and further performs rotation around a vertical rotation axis in this state to rotate the substrate W held by the spin chuck 5 may be adopted instead.

As shown in FIG. 2, the chemical liquid supplying unit 6 includes a chemical liquid nozzle 16, a chemical liquid line 17, connected to the chemical liquid nozzle 16, a recovered chemical liquid supplying unit 18, arranged to supply recovered chemical liquid, recovered from the processing unit 2 (processing cup 8), to the chemical liquid line 17, and a chemical liquid valve 19, switching between supplying and stopping the supplying of chemical liquid from the chemical liquid line 17 to the chemical liquid nozzle 16. The chemical liquid valve 16 is, for example, a fixed nozzle that discharges the chemical liquid in a state where a discharge port of the chemical liquid nozzle 16 is kept still. When the chemical liquid valve 19 is opened, the chemical liquid, supplied from the chemical liquid line 17 to the chemical liquid nozzle 16, is discharged from the chemical liquid nozzle 16 toward an upper surface central portion of the substrate W. The chemical liquid supplying unit 6 may include a chemical liquid nozzle moving apparatus that moves the chemical liquid nozzle 16 to scan a liquid landing position of the chemical liquid with respect to the upper surface of the substrate W within a plane of the substrate W.

As shown in FIG. 2, the recovered chemical liquid supplying unit 18 includes a recovery tank 20, storing the chemical liquid recovered from the processing cup 8, a chemical liquid tank 21, storing the chemical liquid to be supplied to the chemical liquid line 17, a liquid feeding line 22, arranged to feed the chemical liquid, stored in the recovery tank 20, to the chemical liquid tank 21, a first liquid feeding apparatus 23, moving the chemical liquid in the recovery tank 20 to the liquid feeding line 22, a recovered chemical liquid line 24, guiding the chemical liquid in the chemical liquid tank 21 (the chemical liquid flowing through the recovered chemical liquid line 24) to the chemical liquid line 17, a temperature controller 25, heating and temperature controlling the chemical liquid in the chemical liquid tank 21, and a second liquid feeding apparatus 26, moving the chemical liquid in the chemical liquid tank 21 to the recovered chemical liquid line 24. The temperature controller 25 may be immersed in the chemical liquid in the chemical liquid tank 21 or may be interposed at an intermediate portion of the recovered chemical liquid line 24 as shown in FIG. 2. Also, the recovered chemical liquid supplying unit 18 may further include a filter, filtering the chemical liquid flowing through the recovered chemical liquid line 24, and/or a thermometer, measuring a temperature of the chemical liquid flowing through the recovered chemical liquid line 24. Although in the present preferred embodiment, the recovered chemical liquid supplying unit 18 has two tanks, the arrangement of the recovery tank 21 may be omitted and an arrangement, where the chemical liquid recovered from the processing cup 8 is supplied directly to the chemical liquid tank 21, may be adopted instead.

A resist residue removing liquid may be cited as an example of the chemical liquid supplied to the chemical liquid line 17 (that is, the chemical liquid stored in the recovery tank 20). As examples of the resist residue removing liquid, BHF (buffered hydrogen fluoride), SPM (sulfuric acid/hydrogen peroxide mixture), organic solvents (NMP (N-methylpyrrolidone), etc.), nitric acid, ammonium phosphate, organic acids, such as citric acid, etc., and mixtures of such organic acids can be cited.

As shown in FIG. 2, the rinse liquid supplying unit 7 includes a rinse liquid nozzle 27. The rinse liquid nozzle 27 is, for example, a straight nozzle that discharges a liquid in a state of a continuous stream and is disposed fixedly above the spin chuck 5 with its discharge port directed at the upper surface central portion of the substrate W. A rinse liquid line 28, to which the rinse liquid from a rinse liquid supply source is supplied, is connected to the rinse liquid nozzle 27. A rinse liquid valve 29, arranged to switch between discharging and stopping the supply of the rinse liquid from the rinse liquid nozzle 27, is interposed in an intermediate portion of the rinse liquid line 28. When the rinse liquid valve 29 is opened, the rinse liquid of continuous stream, supplied from the rinse liquid line 28 to the rinse liquid nozzle 27, is discharged from the discharge port set at a lower end of the rinse liquid nozzle 27. Also, when the rinse liquid valve 29 is closed, the discharge of the rinse liquid from the rinse liquid line 28 to the rinse liquid nozzle 27 is stopped. Although the rinse liquid is, for example, deionized water (DIW), it is not restricted to DIW and may be any of carbonated water, electrolyzed ion water, hydrogen water, and aqueous hydrochloric acid solution of dilute concentration (for example of approximately 10 to 100 ppm).

Also, the rinse liquid supplying unit 7 may include a rinse liquid nozzle moving apparatus that moves the rinse liquid nozzle 27 to scan a liquid landing position of the rinse liquid with respect to the upper surface of the substrate W within the plane of the substrate W.

As shown in FIG. 2 and FIGS. 3A to 3C, the processing cup 8 includes a circular cylindrical member 30, a plurality of cups 31 and 32, disposed fixedly so as to doubly surround the spin chuck 5 at an inner side of the circular cylindrical member 30, a plurality of guards 33 to 35 (first, second, and third guards 33, 34, and 35), arranged to catch the processing liquid (chemical liquid or rinse liquid) scattered to a periphery of substrate W, and a guard lifting unit 36, elevating and lowering each of the guards 33 to 35 independently. The guard lifting unit 36 has an arrangement that includes, for example, a ball screw mechanism.

The processing cup 8 is collapsible, and deployment and collapsing of the processing cup 8 is performed by the guard lifting unit 36 lifting at least one of the three guards 33 to 35.

As shown in FIG. 2, the first cup 31 has a circular annular shape and, at a position between the spin chuck 5 and the circular cylindrical member 30, surrounds a periphery of the spin chuck 5. The first cup 31 has a shape that is substantially rotationally symmetric with respect to the rotational axis A1 of the substrate W. The first cup 31 has a U-shaped cross section and defines a first groove 40, arranged to collect and drain the processing liquid used to process the substrate W. A drain port 41 is opened at a lowest location of a bottom portion of the first groove 40 and a first drain line 42 is connected to the drain port 41. The processing liquid led into the first drain line 42 is fed to a draining apparatus (not shown; may be a discarding apparatus) and processed by this apparatus.

As shown in FIG. 2, the second cup 32 has a circular annular shape and surrounds a periphery of the first cup 31. The second cup 32 has a shape that is substantially rotationally symmetric with respect to the rotational axis A1 of the substrate W. The second cup 32 has a U-shaped cross section and defines a second groove 43, arranged to collect and recover the processing liquid used to process the substrate W. A drain/recovery port 44 is opened at a lowest location of a bottom portion of the second groove 43 and a common line 45 is connected to the drain/recovery port 44. A recovery line 46 and a second drain line 47 are respectively connected branchingly to the common line 45. The other end of the recovery line 46 is connected to the recovery tank 20 of the recovered chemical liquid supplying unit 18. A recovery valve 48 is interposed in the recovery line 46 and a drain valve 49 is interposed in the second drain line 47. By the recovery valve 48 being opened while the drain valve 49 is closed, the liquid flowing through the common line 45 is led to the recovery line 46. Also, by the drain valve 49 being opened while the recovery valve 48 is closed, the liquid flowing through the common line 45 is led to the second drain line 47. That is, the recovery valve 48 and the drain valve 49 function as a switching unit that switches a flow destination of the liquid, flowing through the common line 45, between the recovery line 46 and the second drain line 47.

As shown in FIG. 2, the innermost first guard 33 surrounds the periphery of the spin chuck 5 and has a substantially rotationally symmetric shape with respect to the rotational axis A1 of the substrate W by the spin chuck 5. The first guard 33 includes a lower end portion 53 of circular cylindrical shape that surrounds the periphery of the spin chuck 5, a cylindrical portion 54, extending outward (in a direction away from the rotational axis A1 of the substrate W) from an upper end of the lower end portion 53, an intermediate portion 55 of circular cylindrical shape that extends vertically upward from an upper surface outer peripheral portion of the cylindrical portion 54, and an upper end portion 56 of circular annular shape extending obliquely upward and inward (in a direction of approaching the rotational axis A1 of the substrate W) from an upper end of the intermediate portion 55. The lower end portion 53 is positioned above the first groove 40 and is housed in an interior of the first groove 40 in a state where the first guard 33 and the first cup 31 are disposed closest to each other. An inner peripheral end of the upper end portion 56 constitutes a circle with a diameter greater than the substrate W, held by the spin chuck 5, in plan view. Also, a cross-sectional shape of the upper end portion 56 may be rectilinear as shown in FIG. 2, etc., or may, for example, extend in a smooth, circular arc.

As shown in FIG. 2, the second innermost second guard 34 surrounds the periphery of the spin chuck 5 at an outer side of the first guard 33 and has a substantially rotationally symmetric shape with respect to the rotational axis A1 of the substrate W by the spin chuck 5. The second guard 34 includes a circular cylindrical portion 57, coaxial to the first guard 33, and an upper end portion 58, extending obliquely upward and toward the center (in the direction of approaching the rotational axis A1 of the substrate W) from an upper end of the circular cylindrical portion 57. An inner peripheral end of the upper end portion 58 constitutes a circle with a diameter greater than the substrate W, held by the spin chuck 5, in plan view. A cross-sectional shape of the upper end portion 58 may be rectilinear as shown in FIG. 2, etc., or may, for example, extend in a smooth, circular arc. A tip of the upper end portion 58 defines an upper opening 8a of the processing cup 8.

The circular cylindrical portion 57 is disposed above the second groove 43. Also, the upper end portion 58 is provided so as overlap with the upper end portion 56 of the first guard 33 in an up-down direction and so as to be disposed close to the upper end portion 56 while maintaining a minute gap with respect thereto in a state where the first guard 33 and the second guard 34 are disposed closest to each other.

As shown in FIG. 2, the outermost third guard 35 surrounds the periphery of the spin chuck 5 at an outer side of the second guard 34 and has a substantially rotationally symmetric shape with respect to the rotational axis A1 of the substrate W by the spin chuck 5. The third guard 35 includes a circular cylindrical portion 60, coaxial to the second guard 34, and an upper end portion 61, extending obliquely upward and toward the center (in the direction of approaching the rotational axis A1 of the substrate W) from an upper end of the circular cylindrical portion 60. An inner peripheral end of the upper end portion 61 constitutes a circle with a diameter greater than the substrate W, held by the spin chuck 5, in plan view. A cross-sectional shape of the upper end portion 61 may be rectilinear as shown in FIG. 2, etc., or may, for example, extend in a smooth, circular arc.

As shown in FIG. 3B, in the present preferred embodiment, a recovery space 100, to which the chemical liquid used in the processing of the substrate W is led, is defined by the guards, the cups, and the common line 45. Specifically, the recovery space 100 includes a space, defined by the second cup 32, the first guard 33, and the second guard 34, and an internal space of the common line 45. Also, an inner wall 101 of the recovery space 100 includes an inner wall of the second cup 32, an outer wall of the first guard 33, an inner wall of the second guard 34, and an inner wall of the common line 45.

As shown in FIG. 2 and FIGS. 3A to 3C, the guard lifting unit 36 elevates and lowers each of the guards 33 to 35 between an upper position, at which the upper end portion of the guard is positioned higher than the substrate W, and a lower position, at which the upper end portion of the guard is positioned lower than the substrate W. The guard lifting unit 36 is capable of holding each of the guars 33 to 35 at any position between the upper position and the lower position. The supplying of the processing liquid to the substrate W and the drying of the substrate W is performed in a state where any of the guards 33 to 35 faces a peripheral end surface of the substrate W.

As shown in FIG. 3A, when the innermost first guard 33 is to be made to face the peripheral end surface of the substrate W, all of the first to third guards 33 to 35 are disposed at the upper positions.

As shown in FIG. 3B, when the second innermost second guard 34 is to be made to face the peripheral end surface of the substrate W, the second and third guards 34 and 35 are disposed at the upper positions and the first guard 33 is disposed at the lower position.

As shown in FIG. 3C, when the outermost third guard 35 is to be made to face the peripheral end surface of the substrate W, the third guard 35 is disposed at the upper position and the first and third guards 33 and 34 are disposed at the lower positions.

Figure 4:
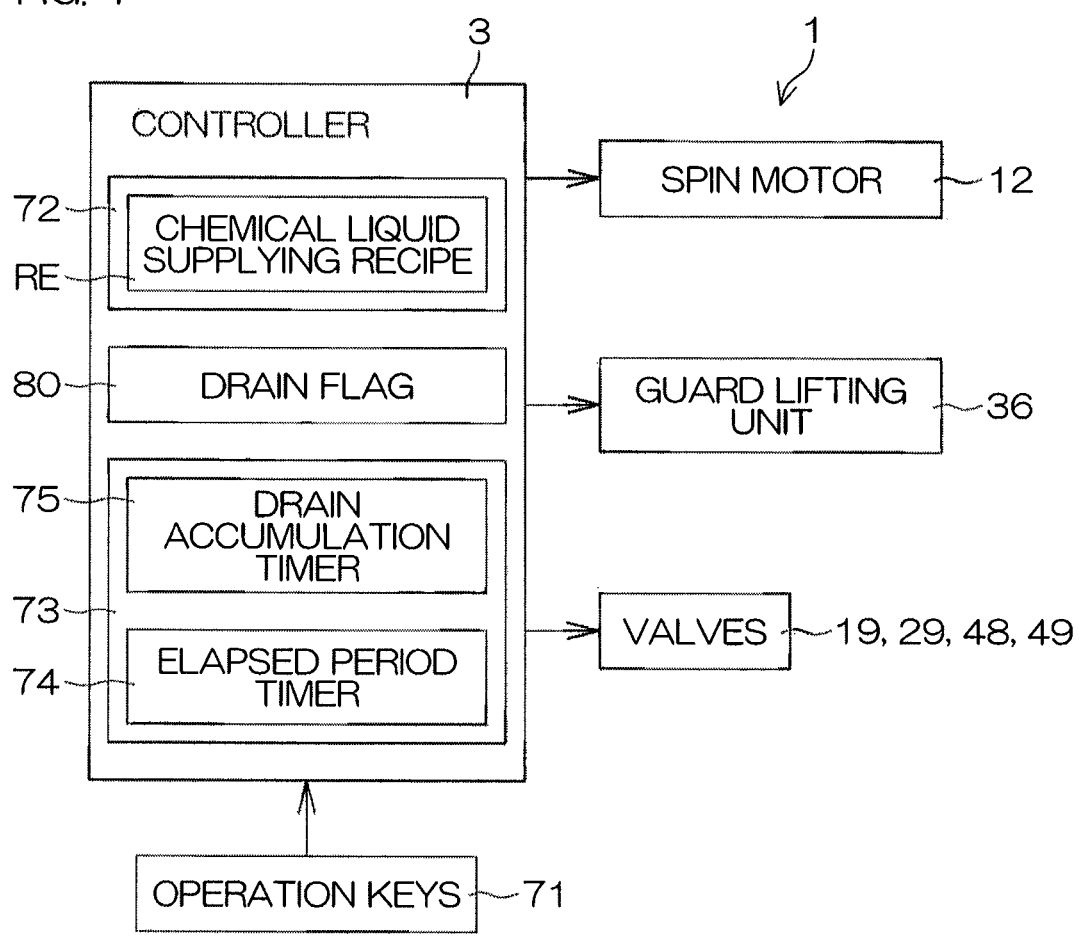
FIG. 4 is a block diagram for describing an electrical arrangement of a main portion of the substrate processing apparatus.

FIG. 4 is a block diagram for describing an electrical arrangement of a main portion of the substrate processing apparatus 1.

The controller 3 is arranged using, for example, a microcomputer. Operation keys 71, operated by a user, etc., of the substrate processing apparatus 1, are connected to the controller 3. The controller 3 has a computing unit, such as CPU, etc., a storage unit, such as a fixed memory device, a hard disk drive, etc., and an input/output unit (not shown). A program executed by the computing unit is stored in the storage unit.

The storage unit includes a recipe storage portion 72, storing contents of the respective processings performed on the substrate W. The recipe storage portion 72 is arranged from a nonvolatile memory, into which data can be rewritten electrically. By operating the operation keys 71, the user can input execution contents, such as rotational speeds of the substrate W in the respective processing processes, etc., to prepare a recipe. The recipe prepared by operating the operation keys 71 is stored (saved) in the recipe storage portion 72.

The storage unit also includes a drain flag 80, which is used to set an opening/closing target valve in a chemical liquid supplying step S3. A predetermined value (5A[H] or 00 [H]) is arranged to be stored selectively in the drain flag 80. In an initial state, 00[H] is stored in the drain flag 80. When 5A[H] is stored in the drain flag 80, the drain flag 80 is in an on state. On the other hand, when 00[H] is stored in the drain flag 80, the drain flag 80 is in an off state.

The controller 3 also has a timer 73 incorporated therein. The timer 73 includes an elapsed period timer (elapsed period measuring unit) 74, arranged to measure an after-the-end elapsed period, which is an elapsed period from an end of the last chemical liquid supplying step S3 (that is, an end of the last chemical liquid discharge from the chemical liquid nozzle 16), and a drain accumulation timer 75, arranged to measure an accumulation of periods in which control such that the drain valve 49 is opened while the recovery valve 48 is closed (control of the switching unit to a drain guiding state) is performed.

Further, the spin motor 12, the guard lifting unit 36, the chemical liquid valve 19, the rinse liquid valve 29, the recovery valve 48, the drain valve 49, etc., are connected as control objects to the controller 3. The controller 3 controls operations of the spin motor 12 and the guard lifting unit 36, etc. The controller 3 opens and closes the chemical liquid valve 19, the rinse liquid valve 29, the recovery valve 48, the drain valve 49, etc.

When a carrier C, housing a plurality of the substrates W, is mounted on a load port LP, a door of the load port LP and a lid of the carrier C are opened, respectively. Thereafter, the controller 3 makes a hand H of the transfer robot IR access the carrier C and take out a substrate W. The substrate W taken out from the carrier C is transferred to the substrate transfer robot CR from the transfer robot IR and carried into a processing unit 2 in a state of being held by a hand H of the substrate transfer robot CR. When the substrate W is carried into the processing unit 2, the computing unit of the controller 3 reads a recipe, corresponding to the substrate W, from the recipe storage portion 72. In the recipe are set control parameters for making the chemical liquid supplying step S3, a rinsing step S4, and a spin drying step S5, to be described below, be executed in that order. The controller 3 then controls the processing unit 2 to execute the series of processings defined in the recipe that has been read.

FIG. 5 is a flow diagram for describing an example of substrate processing performed by the processing unit 2. The substrate processing example shall now be described with reference to FIG. 1 to FIG. 5. A processing executed by the processing unit 2 is a chemical liquid processing that uses the chemical liquid. A resist residue removing processing may be cited as an example of the chemical liquid processing. In regard to the execution of the chemical liquid processing, the recipe read out from the recipe storage portion 72 is referenced constantly.

When the chemical liquid processing is to be applied by the processing unit 2, the uncleaned substrate W is carried into the interior of the chamber 4 (step S1 of FIG. 5).

Specifically, the hand H of the substrate transfer robot CR that holds the substrate W is made to enter the interior of the chamber 4 to transfer the substrate W, with its front surface (surface to be subject to the chemical liquid processing) facing upward, to the spin chuck 5. Thereafter, the substrate W is held by the spin chuck 5. Also, when the hand H is made to enter the interior of the chamber 4, the upper ends of the first to third guards 33 to 35 are all disposed lower than a substrate W holding position as shown in FIG. 2.

Thereafter, the controller 3 starts rotation of the substrate W by the spin motor 12 (step S2 of FIG. 5). The substrate W is first raised to a predetermined liquid processing speed (in a range of approximately 10 to 1200 rpm and being, for example, approximately 300 rpm) and then maintained at the liquid processing speed.

Next, the controller 3 performs the chemical liquid supplying step (step S3 of FIG. 5) of supplying the chemical liquid to the upper surface of the substrate W. The controller 3 controls the guard lifting unit 36 to elevate the second and third guards 34 and 35 respectively to the upper positions and make the second guard 34 face the peripheral end surface of the substrate W as shown in FIG. 3B. Thereafter, the controller 3 opens the chemical liquid valve 19 and makes the chemical liquid be discharged from the chemical liquid nozzle 16 to the upper surface central portion of the substrate W. The chemical liquid supplied to the upper surface of the substrate W receives a centrifugal force due to the rotation of the substrate W and moves to a peripheral edge portion of the substrate W and is scattered toward sides of the substrate W from the peripheral edge portion of the substrate W.

The chemical liquid (for example, the chemical liquid that contains resist residues) that scatters from the peripheral edge portion of the substrate W is caught by the inner wall of the second guard 34 and is led to the common line 45 upon flowing down along the inner wall of the second guard 34 and passing through the second groove 43. The chemical liquid led to the common line 45, in most cases, passes through the recovery line 46 and is fed to the recovered chemical liquid supplying unit 18.

When a predetermined period elapses from the start of discharge of the chemical liquid, the chemical liquid supplying step S3 ends. Specifically, the controller 3 closes the chemical liquid valve 19 to stop the discharge of the chemical liquid from the chemical liquid 16. Also, the controller 3 controls the guard lifting unit 36 to elevate the first guard 33 to the upper position while keeping the second and third guards 34 and 35 respectively at the upper positions and make the first guard 33 face the peripheral end surface of the substrate W as shown in FIG. 3A.

Next, the rinsing step (step S4 of FIG. 5) of supplying the rinse liquid to the upper surface of the substrate W is performed. Specifically, the controller 3 opens the rinse liquid valve 29. The rinse liquid discharged from the rinse liquid nozzle 27 lands on the upper surface central portion of the substrate W and flows along the upper surface of the substrate W toward the peripheral edge portion of the substrate W upon receiving the centrifugal force due to the rotation of the substrate W. The chemical liquid on the substrate W is replaced by the rinse liquid. The rinse liquid flowing on the upper surface of the substrate W scatters to the side of the substrate W from the peripheral edge portion of the substrate W and is caught by the inner wall of the first guard 33. The water flowing down along the inner wall of the first guard 33 is collected at the first groove 40 and is thereafter led to the first drain line 42 and thereafter led to a drain processing apparatus (not shown) arranged to perform drain processing of the processing liquid.

When a predetermined period elapses from the start of discharge of the water, the controller 3 closes the rinse liquid valve 29 to stop the discharge of the rinse liquid from the rinse liquid nozzle 27. The rinsing step S4 is thereby ended. Also, the controller 3 controls the guard lifting unit 36 to lower the first and third guards 33 and 34 to the lower positions while keeping the third guard 35 at the upper position and make the third guard 35 face the peripheral end surface of the substrate W as shown in FIG. 3C.

Next, the spin drying step (step S5 of FIG. 5) of drying the substrate W is performed. Specifically, the controller 3 controls the spin motor 12 to accelerate the substrate W to a drying rotational speed (of, for example, several thousand rpm) that is greater than the rotational speed in the chemical liquid supplying step S3 and the rinsing step S4 and make the substrate W rotate at the drying rotational speed. A large centrifugal force is thereby applied to the liquid on the substrate W and the liquid attached to the substrate W is spun off to a periphery of the substrate W. The liquid is thereby removed from the substrate W and the substrate W dries.

When a predetermined period elapses from the start of high-speed rotation of the substrate W, the controller 3 controls the spin motor 12 to make the rotation of the substrate W by the spin chuck 5 stop (step S6 of FIG. 5). Thereafter, the controller 3 controls the guard lifting unit 36 to lower the third guard 35 to the lower position while keeping the first and third guards 33 and 34 at the lower positions. The upper ends of the first to third guards 33 to 35 are thereby all disposed lower than the substrate W holding position (the state shown in FIG. 2).

Next, the substrate W is carried out from the interior of the chamber 4 (step S7 of FIG. 5). Specifically, the controller 3 makes the hand of the substrate transfer robot CR enter the interior of the chamber 4. The controller 3 then makes the hand of the substrate transfer robot CR hold the substrate W on the spin chuck 5. Thereafter, the controller 3 makes the hand of the substrate transfer robot CR retract from the interior of the chamber 4. The cleaned substrate W is thereby carried out from the chamber 4.

Figure 6A:
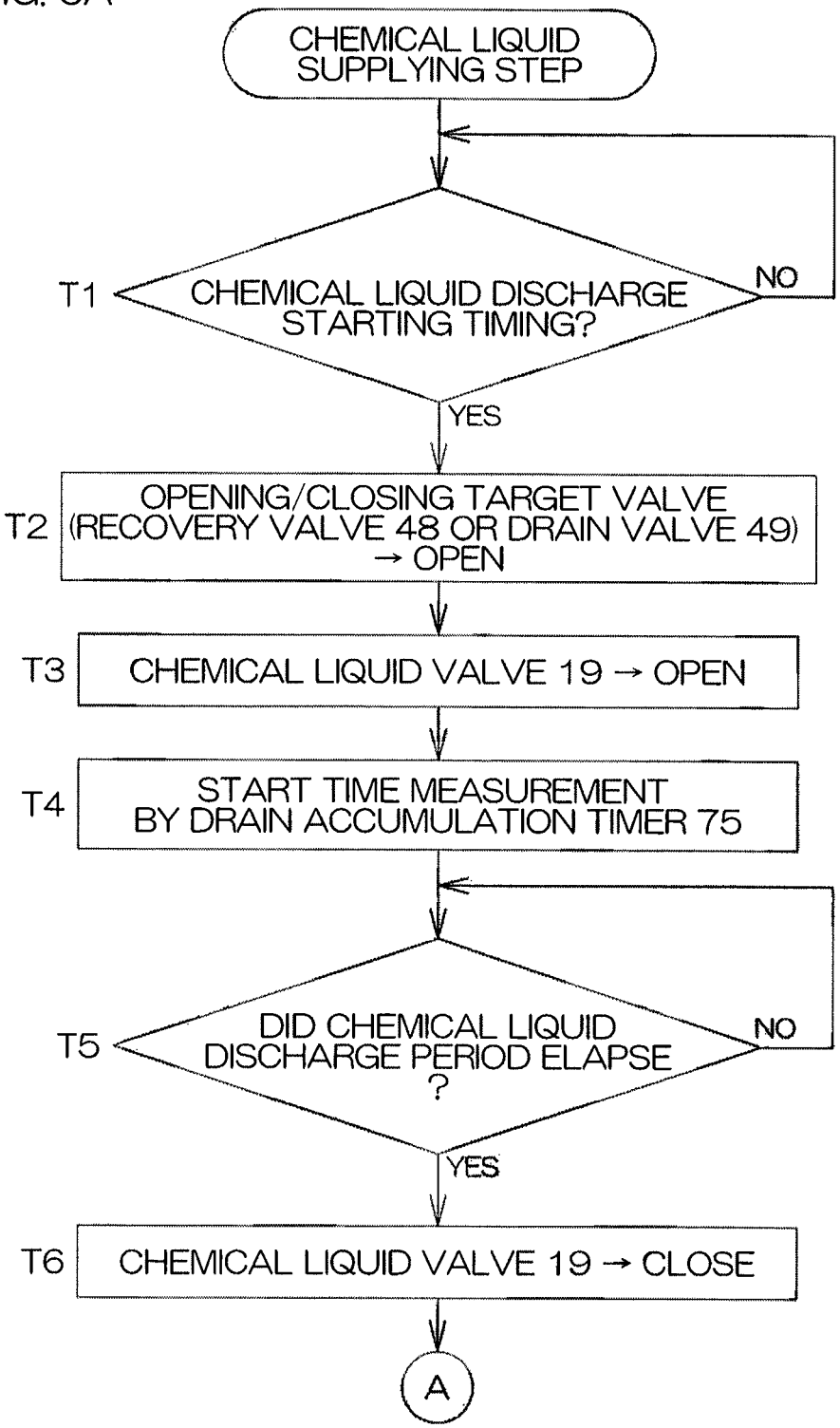
FIG. 6A is a flow diagram for describing a chemical liquid supplying step in detail.
Figure 6B:
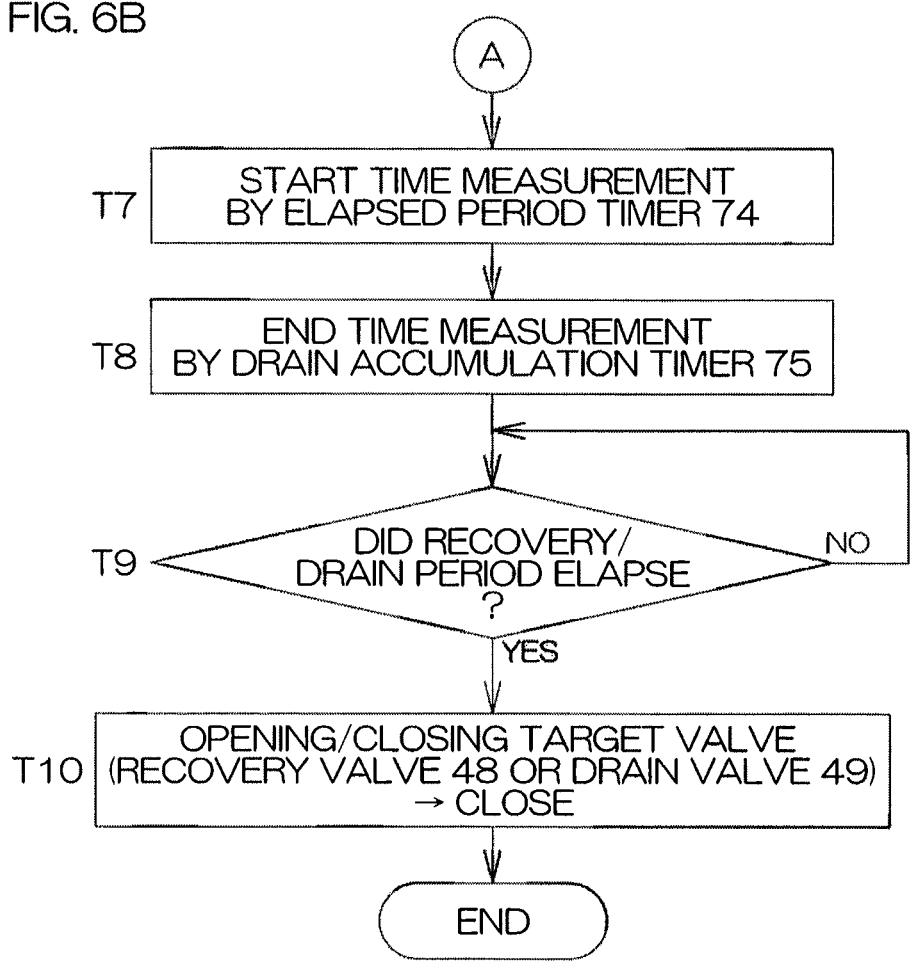
FIG. 6B is a flow diagram for describing the chemical liquid supplying step in detail.
Figure 7:
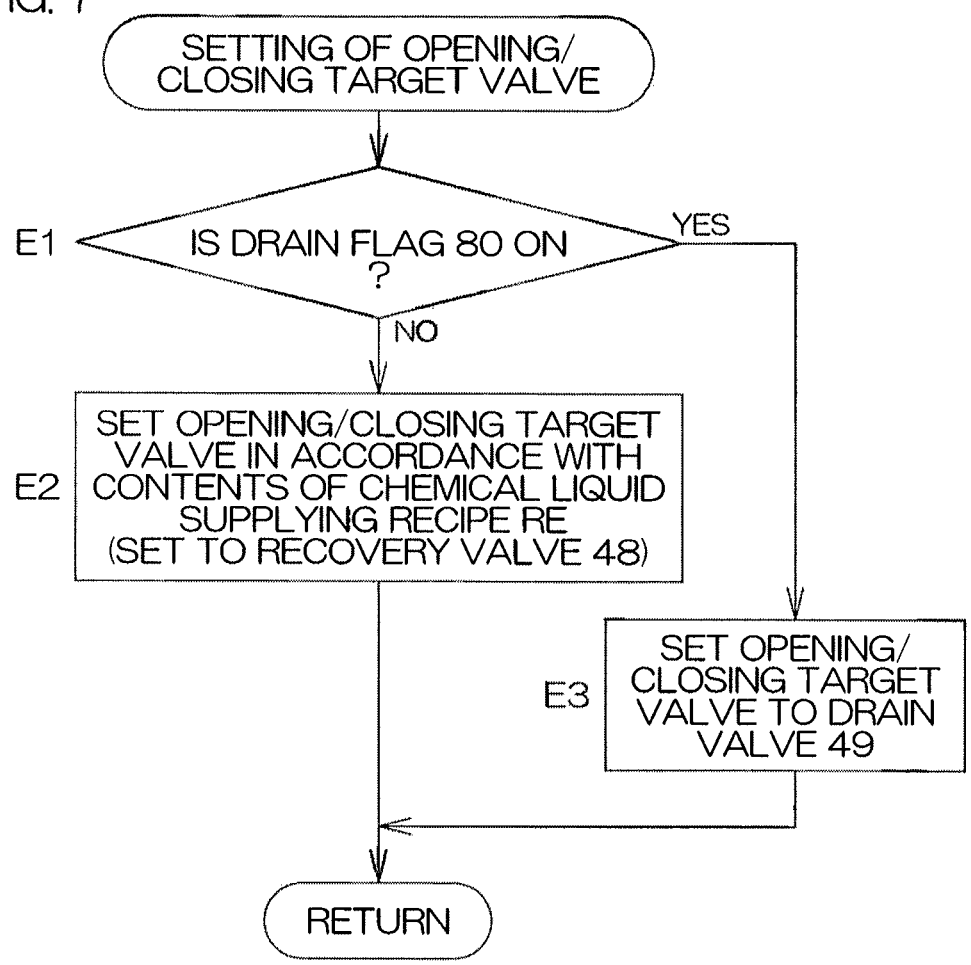
FIG. 7 is a flow diagram for describing setting of an opening/closing target valve in the chemical liquid supplying step.
Figure 8:
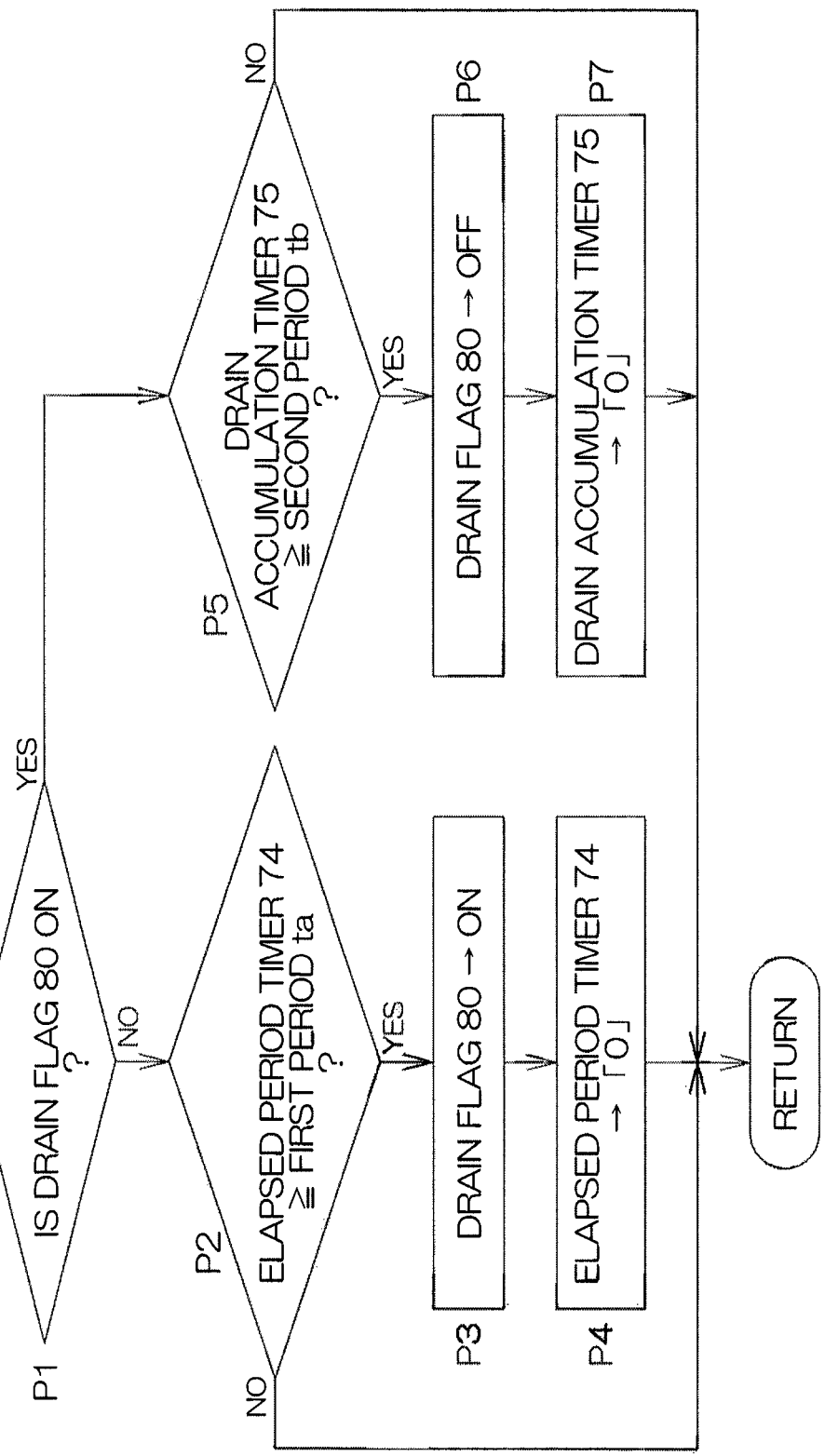
FIG. 8 is a flow diagram of operations of monitoring a timer in the chemical liquid supplying step.
Figure 9:
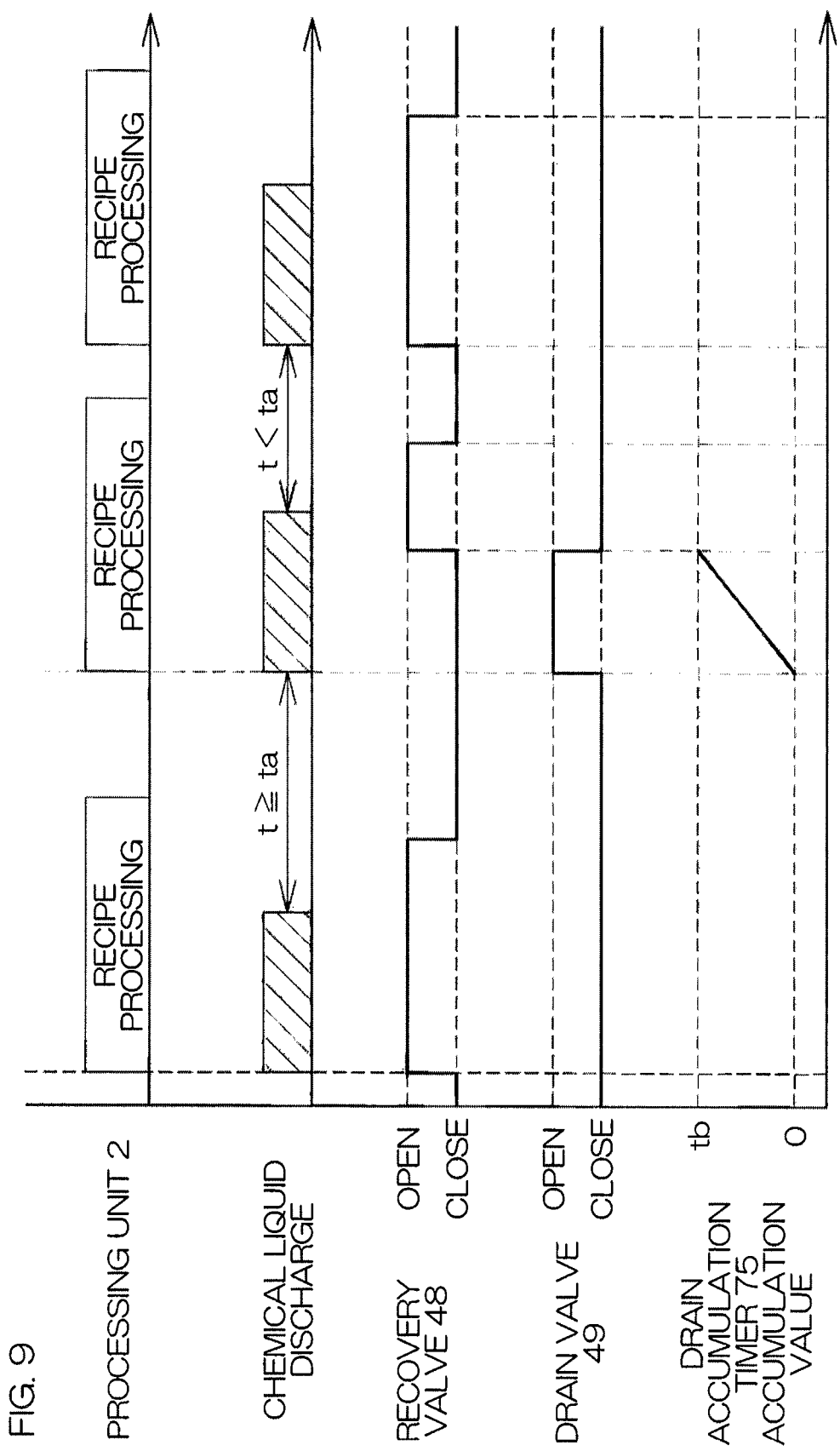
FIG. 9 is an example of a timing chart for describing a plurality of chemical liquid processings executed at the processing unit.

FIGS. 6A and 6B are flow diagrams for describing the chemical liquid supplying step S3 in detail. FIG. 7 is a flow diagram for describing setting of an opening/closing target valve in the chemical liquid supplying step S3. FIG. 8 is a flow diagram of operations of monitoring the timer 73 in the chemical liquid supplying step S3. FIG. 9 is an example of a timing chart for describing a plurality of chemical liquid processings executed at the processing unit 2. The chemical liquid supplying step S3 shall now be described with reference to FIG. 6A to FIG. 9.

The recipe stored (saved) in the recipe storage portion 72 (see FIG. 4) includes a chemical liquid supplying recipe RE (see FIG. 4) used in executing the chemical liquid supplying step S3. Processing conditions in the chemical liquid supplying step S3 are set in the chemical liquid supplying recipe RE. Specifically, the processing conditions, such as the rotational speed of the substrate W, the height positions of the respective guards 33 to 35, a chemical liquid discharge period, etc., in the chemical liquid supplying step S3 are set. It is also designated in the chemical liquid supplying recipe RE that control such that the recovery valve 48 is opened while the drain valve 49 is closed (control of the switching unit to a recovery guiding state) is to be performed in the chemical liquid supplying step S3. The chemical liquid supplying step S3 is executed based on the chemical liquid supplying recipe RE stored in the recipe storage portion 72.

In the chemical liquid supplying step S3, just one of either of the recovery valve 48 and the drain valve 49 is set as the opening/closing target valve that is to be subject to valve opening and closing.

In the chemical liquid supplying step S3, when a predetermined chemical liquid discharge starting timing arrives (YES in step T1 of FIG. 6A), the controller 3 opens the valve, among the recovery valve 48 and the drain valve 49, set as the opening/closing target valve while closing the valve that is not set as the opening/closing target valve (step T2 of FIG. 6A) and opens the chemical liquid valve 19 (step T3 of FIG. 6A).

Specifically, when in step T1, the recovery valve 48 is set as the opening/closing target valve, the controller 3 opens the recovery valve 48 while closing the drain valve 49. On the other hand, when the drain valve 49 is set as the opening/closing target valve, the controller 3 opens the drain valve 49 while closing the drain valve 49.

Also, by the opening of the chemical liquid valve 19, the chemical liquid discharge from the chemical liquid nozzle 16 is started. When the drain valve 49 is set as the opening/closing target valve, time measurement by the drain accumulation timer 75 is started (step T4 of FIG. 6A).

When the chemical liquid discharge period commanded in the chemical liquid supplying recipe RE elapses from the start of discharge of the chemical liquid (YES in step T5 of FIG. 6A), the controller 3 closes the chemical liquid valve 19. The discharge of the chemical liquid from the chemical liquid nozzle 16 is thereby stopped (step T6 of FIG. 6A).

Also, when the chemical liquid discharge period commanded in the chemical liquid supplying recipe RE elapses from the start of discharge of the chemical liquid, time measurement by the elapsed period timer 74 is started (start of elapsed period measuring step; step T7 of FIG. 6B). Also, when time measurement by the drain accumulation timer 75 is being performed, it is ended (step T8 of FIG. 6B).

When a predetermined recovery/drain period elapses from the stopping of discharge of the chemical liquid (YES in step T9 of FIG. 6B), the controller 3 closes the valve, among the recovery valve 48 and the drain valve 49, set as the opening/closing target valve (step T10 of FIG. 6B). Specifically, when the recovery valve 48 is set as the opening/closing target valve, the recovery valve 48 is closed. On the other hand, when the drain valve 49 is set as the opening/closing target valve, the drain valve 49 is closed.

As shown in FIG. 7, whether the value of the drain flag 80 (see FIG. 4) is 00[H] or 5A[H] is constantly monitored by the computing unit of the controller 3.

When the value of the drain flag 80 is 00[H] (drain flag: off) (NO in step E1 of FIG. 7), the computing unit of the controller 3 sets the opening/closing target valve based on the contents of the chemical liquid supplying recipe RE (step E2 of FIG. 7). As mentioned above, it is designated in the chemical liquid supplying recipe RE that control such that the recovery valve 48 is opened while the drain valve 49 is closed is to be performed, and therefore in accordance with this designation, the computing unit of the controller 3 sets the recovery valve 48 as the opening/closing target valve.

On the other hand, when the value of the drain flag 80 is 5A[H] (drain flag: on) (YES in step E1 of FIG. 7), the controller 3 ignores the command in the chemical liquid supplying recipe RE and sets the drain valve 49 as the opening/closing target valve.

The on/off of the drain flag 80 is switched using the elapsed period timer 74.

As shown in FIG. 8, the computing unit of the controller 3 constantly monitors the time measurement values of the elapsed period timer 74 and the drain accumulation timer 75.

When, in the case where the value of the drain flag 80 is 00[H] (drain flag: off) (NO in step P1 of FIG. 8), the time measurement value of the elapsed period timer 74 reaches a predetermined first period ta (YES in step P2 of FIG. 8), the computing unit of the controller 3 stores the value 5A[H] in the drain flag 80 (drain flag: on) (step P3 of FIG. 8), resets the time measurement value of the elapsed period timer 74, and ends the time measurement by the elapsed period timer 74 (end of the elapsed period measuring step; step P4 of FIG. 8). On the other hand, when the time measurement value of the elapsed period timer 74 has not reached the first period ta (NO in step P2 of FIG. 8), a return is thereafter performed in the processing shown in FIG. 8. That is, the processing in which the NO judgment is made in step P2 of FIG. 8 is repeated until the time measurement value of the elapsed period timer 74 reaches the first period ta. The first period ta is set, for example, on the basis of a period such that the chemical liquid remaining in the recovery space 100 becomes altered. The first period ta is provided to be changeable as appropriate in accordance with the type of chemical liquid. For example, in an example where BHF is used as the chemical liquid, the first period ta is set, for example, to 6 hours.

On the other hand, when, in the case where the value of the drain flag 80 is 5A[H] (drain flag: on) (YES in step P1 of FIG. 8), the time measurement value of the drain accumulation timer 75 reaches a predetermined second period tb (YES in step P5 of FIG. 8), the computing unit of the controller 3 clears the value of the drain flag 80 to zero (stores the value 00[H] in the drain flag 80; drain flag: off) (step P6 of FIG. 8), resets the time measurement value of the drain accumulation timer 75, and ends the time measurement by the drain accumulation timer 75 (step P7 of FIG. 8). On the other hand, when the time measurement value of the drain accumulation timer 75 has not reached the second period tb (NO in step P5 of FIG. 8), a return is thereafter performed in the processing shown in FIG. 8. That is, the processing in which the NO judgment is made in step P5 of FIG. 8 is repeated until the time measurement value of the drain accumulation timer 75 reaches the second period tb.

Next, a plurality of chemical liquid processings executed at the processing unit 2 shall be discussed with reference to FIG. 9. The chemical liquid processing (recipe processing) is executed successively in each chamber 4 of the processing unit 2.

In each chemical liquid processing, it is checked, at the start of the chemical liquid supplying step S3, whether or not the predetermined first period to elapsed from the end of the last chemical liquid supplying step S3 (that is, whether or not the time measurement value t of the elapsed period timer 74 is such that t≥ta). When the predetermined first period ta has not elapsed from the end of the last chemical liquid supplying step S3, the control such that the recovery valve 48 is opened while the drain valve 49 is closed (control of the switching unit to the recovery guiding state) is executed, and on the other hand, when the predetermined first period ta elapsed from the end of the last chemical liquid supplying step S3, the control such that the drain valve 49 is opened while the recovery valve 48 is closed (control of the switching unit to the drain guiding state) is executed.

When, after the control such that the drain valve 49 is opened while the recovery valve 48 is closed (control of the switching unit to the drain guiding state) has been started, the accumulation of periods, in which such control is executed, reaches the predetermined period tb (when a predetermined draining ending condition is established), the controller 3 returns to the control such that the recovery valve 48 is opened while the drain valve 49 is closed (control of the switching unit to the recovery guiding state). As the second period tb, for example, 3 minutes is set. Thereafter, starting of the chemical liquid supplying at an interval less than the first period to is repeated until processings of a predetermined number of substrates W end and therefore the control such that the recovery valve 48 is opened while the drain valve 49 is closed (control of the switching unit to the recovery guiding state) is maintained until the end of the chemical liquid processings.

Figure 10:
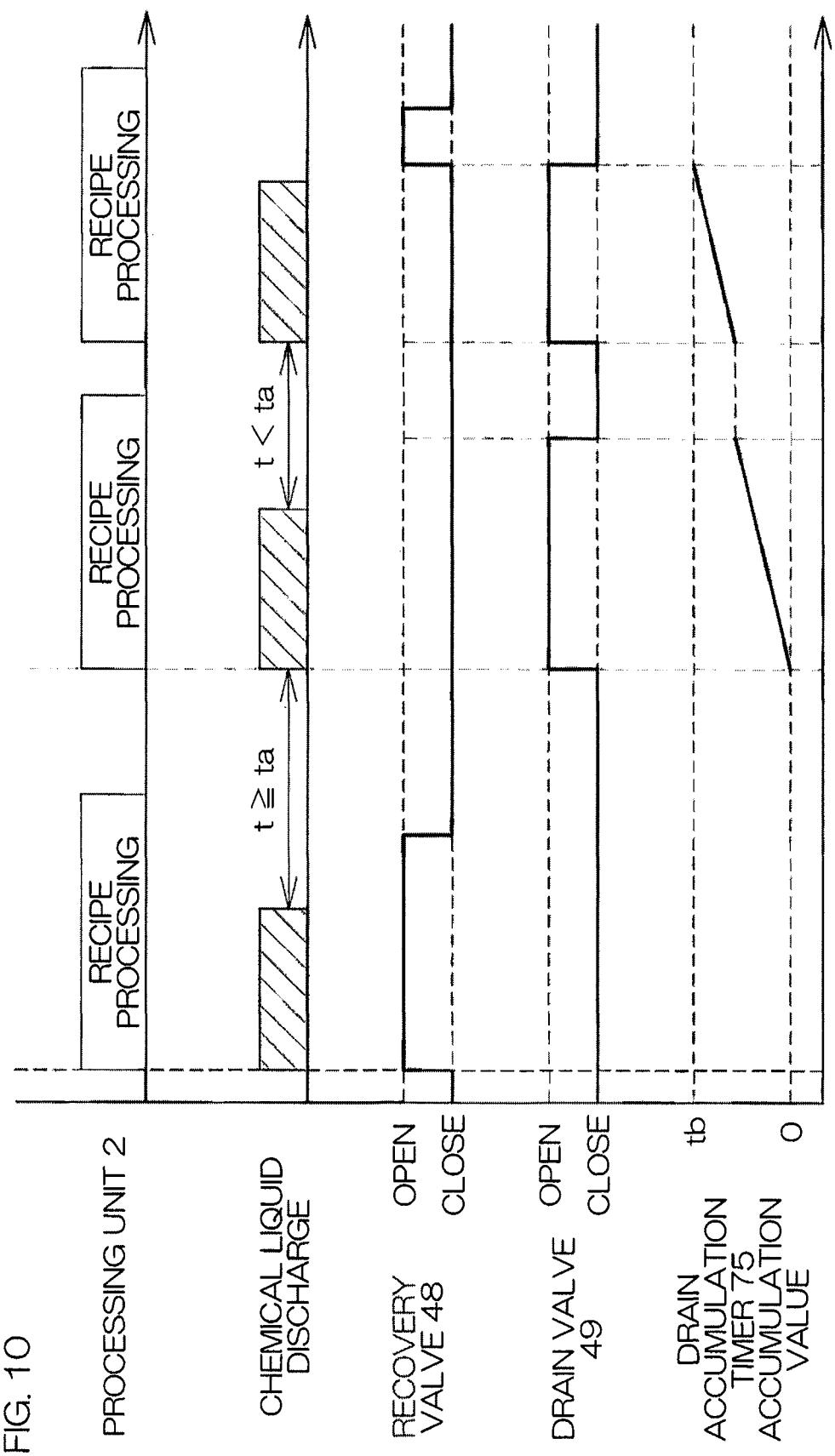
FIG. 10 is another example of a timing chart for describing a plurality of chemical liquid processings executed at the processing unit.

FIG. 10 is another example of a timing chart for describing a plurality of chemical liquid processings executed at the processing unit 2.

In FIG. 10, in the first chemical liquid processing upon restarting chemical liquid processing from a pause state extending over a long term, the control such that the drain valve 49 is opened while the recovery valve 48 is closed (control of the switching unit to the drain guiding state) is maintained. Return from the control such that the drain valve 49 is opened while the recovery valve 48 is closed (control of the switching unit to the drain guiding state) to the control such that the recovery valve 48 is opened while the drain valve 49 is closed (control of the switching unit to the recovery guiding state) is then performed in a middle of the chemical liquid processing of the second time onward. In other words, the control such that the drain valve 49 is opened while the recovery valve 48 is closed (control of the switching unit to the drain guiding state: draining step) is enabled to be executed across a plurality (for example, two) of chemical liquid supplying steps S3 (across the chemical liquid processings of a plurality of substrates).

By the above, with the present preferred embodiment, when, at the start of the chemical liquid supplying step S3, the first period ta elapsed from the end of the last chemical liquid supplying step, the control such that the drain valve 49 is opened while the recovery valve 48 is closed (control of the switching unit to the drain guiding state) is executed. When a long period elapsed from the end of the last chemical liquid supplying step S3, the chemical liquid remaining in the recovery space 100, that is, the chemical liquid attached to the inner walls of the guards or the chemical liquid retained in an interior of the common line 45 may be altered. As the first period ta, for example, 6 hours is set.

For example, when, as the chemical liquid discharged from the chemical liquid nozzle 16, a resist residue removing liquid, such as BHF, etc., is used, a resist component dissolved in the chemical liquid attached to the inner wall of the second cup 32, the outer wall of the first guard 33, the inner wall of the second guard 34, or the inner wall of the common line 45 (that is, the inner wall 101 of the recovery space 101) crystallizes (becomes altered) due to the elapse of time. In this case, the chemical liquid (altered chemical liquid) containing the crystallized resist as foreign matter may be supplied to the recovered chemical liquid supplying unit 18. Also with the elapse of time, the chemical liquid retained in the interior of the common line 45 becomes concentrated (altered). When such a concentrated chemical liquid is supplied to the recovered chemical liquid supplying unit 18, a resist component dissolved in the chemical liquid may precipitate and the resist may also become present as foreign matter in the chemical liquid inside the recovered chemical liquid supplying unit 18. When such an altered chemical liquid is supplied to the recovered chemical liquid supplying unit 18, the chemical liquid containing the altered chemical liquid may be supplied to the substrate W in a subsequent chemical liquid processing.

However, with the present preferred embodiment, a guiding destination of the altered chemical liquid is set not to the recovery line 46 but to the drain line 47 and therefore mixing of the altered chemical liquid into the chemical liquid led into the recovery line 46 can be prevented.

Also, when, after the control such that the drain valve 49 is opened while the recovery valve 48 is closed (control of the switching unit to the drain guiding state) is started, the accumulation of periods, in which the control such that the drain valve 49 is opened while the recovery valve 48 is closed (control of the switching unit to the drain guiding state) is executed, reaches the predetermined second period tb (when the predetermined draining ending condition is established), the controller 3 returns to the control such that the recovery valve 48 is opened while the drain valve 49 is closed (control of the switching unit to the recovery guiding state). As the second period tb, for example, 3 minutes is set. Thereafter, the starting of the chemical liquid supplying at an interval less than the first period ta is repeated until processings of the predetermined number of substrates W end and therefore the control such that the recovery valve 48 is opened while the drain valve 49 is closed (control of the switching unit to the recovery guiding state) is maintained until the end of the chemical liquid processings. Therefore, in restarting the chemical liquid supplying after a pause extending over a long period, the chemical liquid led into the recovery space 100 is drained only in the processings of one or several substrates W after the restart of chemical liquid supplying after the pause extending over the long period, and subsequently, the chemical liquid led into the recovery space 100 is recovered and reused. Therefore, in comparison to a case where the chemical liquid led into the recovery space 100 is drained in the processings of all substrates of one lot (of, for example, 25 substrates) after the restart of chemical liquid supplying, a recovery amount of the chemical liquid can be increased and further reduction of consumption amount of the chemical liquid can thereby be achieved.

By the above, the substrate processing apparatus 1, with which the substrate W can be processed using a chemical liquid that does not contain an altered chemical liquid and further reduction of consumption amount of the chemical liquid can be achieved, can be provided.

Figure 11:
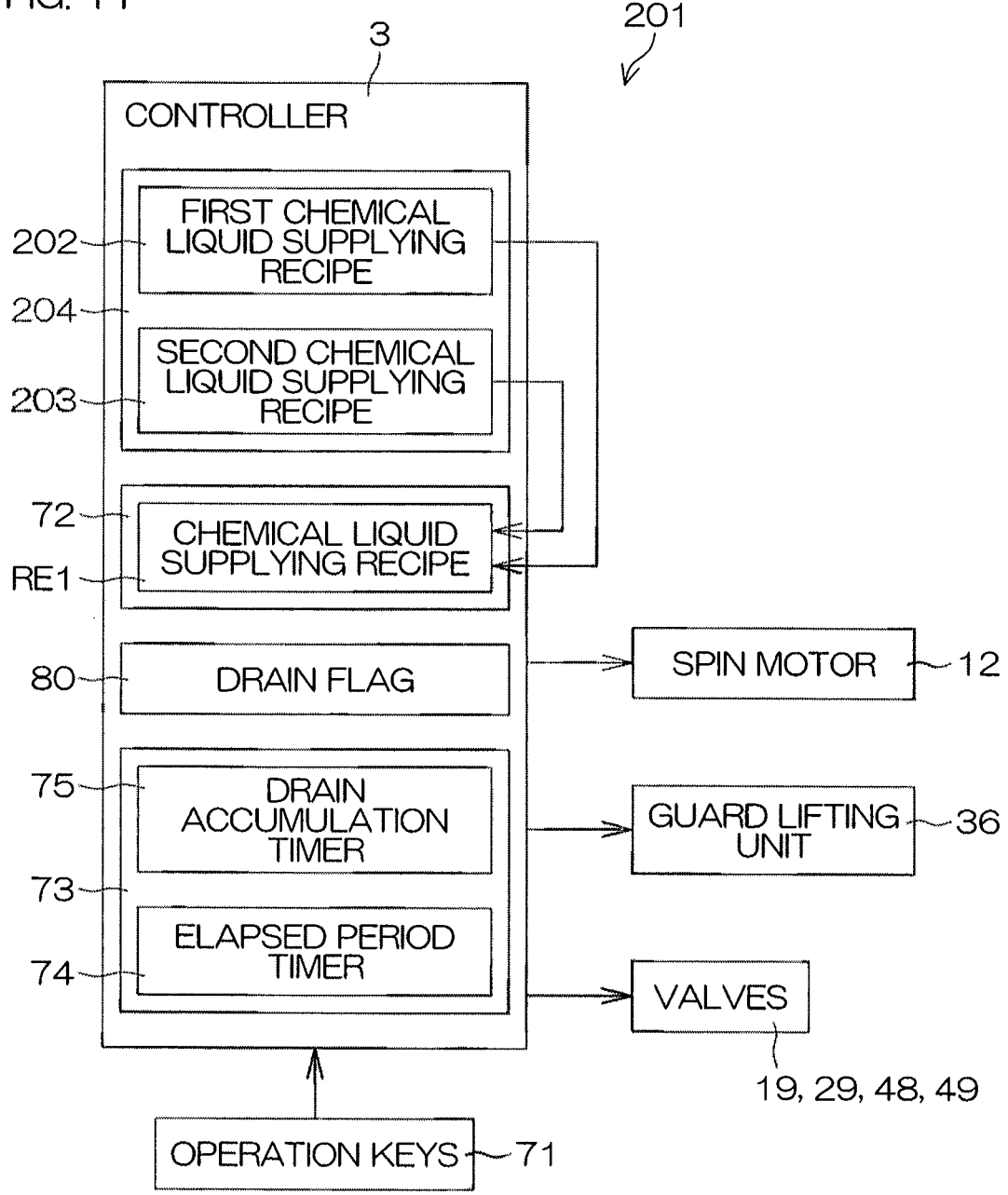
FIG. 11 is a block diagram for describing an electrical arrangement of a main portion of a substrate processing apparatus according to a second preferred embodiment of the present invention.

FIG. 11 is a block diagram for describing an electrical arrangement of a main portion of a substrate processing apparatus 201 according to a second preferred embodiment of the present invention. In FIG. 11, portions corresponding to the respective portions indicated in the first preferred embodiment are indicated with the same reference symbols as in FIG. 1 to FIG. 10 attached thereto and description thereof shall be omitted. In the present preferred embodiment, each of a first chemical liquid supplying recipe 202 and a second chemical liquid supplying recipe 203 is prepared as a chemical liquid supplying recipe RE1 to be stored (saved) in the recipe storage portion 72 (see FIG. 4). The first chemical liquid supplying recipe 202 and the second chemical liquid supplying recipe 203 are held in a recipe tentative holding portion 204.

In the first chemical liquid supplying recipe 202, it is designated, as in the case of the chemical liquid supplying recipe RE of the first preferred embodiment, that the control such that the recovery valve 48 is opened while the drain valve 49 is closed (control of the switching unit to the recovery guiding state) is to be performed in the chemical liquid supplying step S3.

On the other hand, in the second chemical liquid supplying recipe 203, it is designated that the control such that the drain valve 49 is opened while the recovery valve 48 is closed (control of the switching unit to the drain guiding state) is to be performed in the chemical liquid supplying step S3.

In regard to processing conditions besides the above (processing conditions, such as the rotational speed of the substrate W, the height positions of the respective guards 33 to 35, the chemical liquid discharge period, etc.), there are no points of difference between the first chemical liquid supplying recipe 202 and the second chemical liquid supplying recipe 203.

The chemical liquid supplying step S3 is executed based on the chemical liquid supplying recipe RE1 stored in the recipe storage portion 72. In executing the chemical liquid supplying step S3, the chemical liquid supplying recipe RE1 is referenced constantly.

During execution of chemical liquid processings, whether the value of the drain flag 80 (see FIG. 4) is 00[H] or 5A[H] is constantly monitored by the controller 3.

When the value of the drain flag 80 is 00[H] (drain flag: off), the controller 3 makes the first chemical liquid supplying recipe 202 be stored as the chemical liquid supplying recipe RE1 in the recipe storage portion 72. Thereafter, the control such that the recovery valve 48 is opened while the drain valve 49 is closed (control of the switching unit to the recovery guiding state) is executed.

On the other hand, when the value of the drain flag 80 is 5A[H] (drain flag: on), the controller 3 makes the second chemical liquid supplying recipe 203 be stored as the chemical liquid supplying recipe RE1 in the recipe storage portion 72. Thereafter, the control such that the drain valve 49 is opened while the recovery valve 48 is closed (control of the switching unit to the drain guiding state) is executed.

By performing such switching of the chemical liquid supplying recipe RE1, actions and effects equivalent to those of the first preferred embodiment described above can be exhibited.

Although two preferred embodiments of the present invention were described above, the present invention can be implemented in yet other modes.

For example, in each of the preferred embodiments described above, the values of the first period ta and the second period tb, stored in the storage unit of the controller 3, may be provided to be changeable by operation of the operation keys 71. In this case, the user can change the values of the first period ta and the second period tb as appropriate.

Also, whether or not the control such that the drain valve 49 is opened while the recovery valve 48 is closed (control of the switching unit to the drain guiding state) is to be performed in restarting the chemical liquid supplying after a pause extending over a long period may be arranged to be selectively determined by the user. For example, the selective determination may be arranged to be made by operation of the operation keys 71.

Also, as a draining ending condition, by which the control such that the drain valve 49 is opened while the recovery valve 48 is closed (control of the switching unit to the drain guiding state) is switched to the control such that the recovery valve 48 is opened while the drain valve 49 is closed (control of the switching unit to the recovery guiding state) in each of the preferred embodiments described above, a draining ending condition other than the draining ending condition that the accumulation of periods in which such control is executed reaches the second period tb may be provided instead (or additionally). For example, that an accumulation of drain flow volume (accumulated drain flow volume) during execution of the control such that the drain valve 49 is opened while the recovery valve 48 is closed (control of the switching unit to the drain guiding state) reaches a predetermined flow volume may be provided as another draining ending condition.

Also, as the chemical liquid supplied to the recovered chemical liquid supplying unit 18, a chemical liquid other than a resist residue removing liquid may be used. As examples of the chemical liquid other than the resist residue removing liquid, BHF, DHF (dilute hydrofluoric acid), SC1 (ammonia/hydrogen peroxide mixture), SC2 (hydrochloric acid/hydrogen peroxide mixture), organic solvents (such as NMP and acetone), nitric acid, ammonium phosphate, organic acids, such as citric acid, etc., and mixtures of such organic acids can be cited. When, in this case, the method described above is not adopted, the chemical liquid, attached to the inner wall of the second cup 32, the outer wall of the first guard 33, or the inner wall of the second guard 34 (that is, the inner wall of the recovery space), may in itself become crystallized (altered) or the chemical liquid retained in the interior of the common line 45 may become concentrated (altered) with the elapse of time and may affect a concentration of the chemical liquid stored in the recovery tank 20 and/or the chemical liquid tank 21.

Also, with each of the preferred embodiments described above, the switching unit may be constituted of a three-way valve instead of two opening/closing valves (the recovery valve 48 and the drain valve 49).

Also, with each of the preferred embodiments, the recovery line 46 and the second drain line 47 may be connected to the second groove 43. In this case, the common line 45 is not present. In this case, the recovery space 100 is constituted of a space that does not include the interior of the common line 45 and is defined by the cups and 33.

Also, with each of the preferred embodiments, the recovery line 46 may be provided in relation not only to the second groove 43 but also to the first groove 40.

Also, although an arrangement where the processing cup 8 is of three stages was described as an example, the processing cup may be of one stage (single cup) or two stages or may be a multiple stage cup of four stages or more.

Also, although with each of the preferred embodiments described above, the case where the substrate processing apparatus 1 is an apparatus that processes a disk-shaped substrate was described, the substrate processing apparatus 1 may instead be an apparatus that processes a polygonal substrate, such as a glass substrate for liquid crystal display device, etc.

While preferred embodiments of the present invention have been described in detail above, these are merely specific examples used to clarify the technical contents of the present invention, and the present invention should not be interpreted as being limited only to these specific examples, and the spirit and scope of the present invention shall be limited only by the appended claims.

The present application corresponds to Japanese Patent Application No. 2016-146521 filed on Jul. 26, 2016 in the Japan Patent Office, and the entire disclosure of this application is incorporated herein by reference.

What is claimed is:

1. A substrate processing method, executed in a substrate processing apparatus including a recovery cup, having defined therein a recovery space to which a chemical liquid used in processing of a substrate is led, and a recovery/drain unit which recovers or drains a chemical liquid recovered in the recovery cup, wherein the recovery/drain unit includes a common line connected to the recovery cup, a recovery line connected to the common line and arranged to recover the chemical liquid led to the recovery space, a drain line connected to the common line and arranged to drain a chemical liquid led to the recovery space, and a switching unit for switching a destination of the chemical liquid led to the common line between the recovery line and the drain line, the substrate processing method comprising:
a storage step of storing in a storage portion a predetermined draining ending condition for switching the recovery/drain unit from a drain guiding state where the chemical liquid led to the common line is led to the drain line to a recovery guiding state where the chemical liquid led to the common line is led to the recovery line:
a chemical liquid supplying step of supplying the chemical liquid to the substrate, the chemical liquid supplying step being executed a plurality of times;
an elapsed period measuring step of measuring an after-the-end elapsed period that is an elapsed period from an end of a last chemical liquid supplying step that has already ended to a start of a next chemical liquid supplying step;
a recovery step of realizing the recovery guiding state of the recovery/drain unit, when, at the start of the next chemical liquid supplying step, the after-the-end elapsed period is less than a predetermined first period;
a draining step of realizing the drain guiding state of the recovery/drain unit, when, at the start of the next chemical liquid supplying step, the after-the-end elapsed period is not less than the predetermined first period;
a step of detecting whether the predetermined draining ending condition is established; and
a switching step of switching from the drain guiding state to the recovery guiding state by switching the switching unit based on establishment of the predetermined draining ending condition.

2. The substrate processing method according to claim 1, wherein
the storage portion includes a recipe storage portion, storing a chemical liquid supplying recipe that sets a condition of chemical liquid supplying in the next chemical liquid supplying step,
the switching unit is controlled by a controller that controls the switching unit, in the next chemical liquid supplying step, in accordance with the chemical liquid supplying recipe stored in the recipe storage portion while applying a modification to the chemical liquid supplying recipe depending on a judgement whether the after-the-end elapsed period is not less than the predetermined first period at the start of the next chemical liquid supplying step,
the chemical liquid supplying recipe includes an instruction commanding that the switching unit is to be controlled so that the recovery/drain unit is in the recovery guiding state,
the controller follows the instruction included in the chemical liquid supplying recipe, and controls the switching unit so that the recovery/drain unit is in the recovery guiding state, if the after-the-end elapsed period is less than the predetermined first period at the start of the next chemical liquid supplying step, and
the controller ignores the instruction included in the chemical liquid supplying recipe to apply the modification thereto, and controls the switching unit so that the recovery/drain unit is in the drain guiding state, if the after-the-end elapsed period is not less than the predetermined first period at the start of the next chemical liquid supplying step.

3. The substrate processing method according to claim 1, wherein the storage portion further stores a first chemical liquid supplying recipe that sets a condition of chemical liquid supplying applicable in the next chemical liquid supplying step, and a second chemical liquid supplying recipe that sets another condition of chemical liquid supplying applicable in the next chemical liquid supplying step,
the first chemical liquid supplying recipe includes an instruction commanding that the switching unit is to be controlled so that the recovery/drain unit is in the recovery guiding state,
the second chemical liquid supplying recipe includes an instruction commanding that the switching unit is to be controlled so that the recovery/drain unit is in the drain guiding state,
the switching unit is controlled by a controller in accordance with the first chemical liquid supplying recipe in the next chemical liquid supplying step if the after-the-end elapsed period is less than the predetermined first period at the start of the next chemical liquid supplying step, and
the switching unit is controlled by the controller in accordance with the second chemical liquid supplying recipe in the next chemical liquid supplying step if the after-the-end elapsed period is not less than the predetermined first period at the start of the next chemical liquid supplying step.

4. The substrate processing method according to claim 1, further comprising,
a last draining step, corresponding to the last chemical liquid supplying step, that realizes the drain guiding state of the recovery/drain unit to lead the chemical liquid supplied to the substrate in the last chemical liquid supplying step to the drain line, and
a drain execution period measurement step to measure a drain execution period which is a total period of a period required to execute the last draining step and a period required to execute the draining step corresponding to the next chemical liquid supplying step,
wherein the predetermined draining ending condition is that the drain execution period reaches a predetermined second period.

5. The substrate processing method according to claim 4, wherein the draining step corresponding to the next chemical liquid supplying step is performed in parallel with the next chemical liquid supplying step from the start of the next chemical liquid supplying step, if the period required for execution of the last draining step does not reach the predetermined second period at an end of the last draining step.

6. A substrate processing apparatus comprising:
a chemical liquid supplying unit, supplying a chemical liquid to a substrate;
a recovery cup, having defined therein a recovery space to which the chemical liquid used in processing the substrate is led; and
a recovery/drain unit which recovers or drains a chemical liquid recovered in the recovery cup; and
the recovery/drain unit includes
a common line connected to the recovery cup,
a recovery line, connected to the common line and used to recover the chemical liquid led to the recovery space;
a drain line, connected to the common line and used to discard a chemical liquid led to the recovery space;
a switching unit for switching a destination of the chemical liquid, led to the common line, between the recovery line and the drain line;

a storage portion for storing a predetermined draining ending condition for switching the recovery/drain unit from a drain guiding state where the chemical liquid led to the common line is led to the drain line to a recovery guiding state where the chemical liquid led to the common line is led to the recovery line; and a controller; and wherein the controller configured to execute a chemical liquid supplying step of controlling the chemical liquid supplying unit to supply the chemical liquid to a substrate, the chemical liquid supplying step executed a plurality of times, an elapsed period measuring step of measuring an after-the-end elapsed period that is an elapsed period from an end of a last chemical liquid supplying step that has already ended to a start of a next chemical liquid supplying step, a recovery step of realizing the recovery guiding state of the recovery/drain unit by the switching unit, when, at the start of the next chemical liquid supplying step, the after-the-end elapsed period is less than a predetermined first period, a draining step of realizing the drain guiding state of the recovery/drain unit by the switching unit, when, at the start of the next chemical liquid supplying step, the after-the-end elapsed period is not less than the predetermined first period, a step of detecting whether the predetermined draining ending condition is established, and a switching step of switching from the drain guiding state to the recovery guiding state by switching the switching unit based on establishment of the predetermined draining ending condition.

7. The substrate processing apparatus according to claim 6, wherein the storage portion includes a recipe storage portion, storing a chemical liquid supplying recipe that sets a condition of chemical liquid supplying in the next chemical liquid supplying step;

the controller controls the switching unit, in the next chemical liquid supplying step, in accordance with the chemical liquid supply recipe stored in the recipe storage portion while applying a modification to the chemical liquid supplying recipe depending on a judgement whether the after-the-end elapsed period is not less than the predetermined first period at the start of the next chemical liquid supplying step, the chemical liquid supplying recipe includes an instruction commanding that the switching unit is to be controlled so that the recovery/drain unit is in the recovery guiding state, the controller follows the instruction included in the chemical liquid supplying recipe, and controls the switching unit so that the recovery/drain unit is in the recovery guiding state, if the after-the-end elapsed period is less than the predetermined first period at the start of the next chemical liquid supplying step, and the controller ignores the instruction included in the chemical liquid supplying recipe to apply the modification thereto, and controls the switching unit so that the recovery/drain unit is to be in the drain guiding state when the after-the-end elapsed period is not less than the predetermined first period at the start of the next chemical liquid supply step.

8. The substrate processing apparatus according to claim 6, wherein the storage portion further stores a first chemical liquid supplying recipe that sets a condition of chemical liquid supplying applicable in the next chemical liquid supplying step, and a second chemical liquid supplying recipe that sets another condition of chemical liquid supplying applicable in the next chemical liquid supplying step;

the first chemical liquid supplying recipe includes an instruction commanding that the switching unit is to be controlled to be in the recovery guiding state, the second chemical liquid supplying recipe includes an instruction commanding that the switching unit is to be controlled so that the recovery/drain unit is in the drain guiding state, the controller controls the switching unit in accordance with the first chemical liquid supplying recipe in the next chemical liquid supplying step when after-the-end elapsed period is less than the predetermined first period at the start of the next chemical liquid supply step, and the controller controls the switching unit in accordance with the second chemical liquid supplying recipe in the next chemical liquid supplying step when after-the-end elapsed period is not less than the predetermined first period at the start of the next chemical liquid supply step.

9. The substrate processing apparatus according to claim 6, wherein the controller is configured to further execute a last draining step, corresponding to the last chemical liquid supplying step, that realizes the drain guiding state of the recovery/drain unit to lead the chemical liquid supplied to the substrate in the last chemical liquid supplying step to the drain line, and a drain execution period measurement step to measure a drain execution period which is a total period of a period required to execute the last draining step and a period required to execute the draining step corresponding to the next chemical liquid supplying step, wherein the predetermined draining ending condition is that the drain execution period reaches a predetermined second period.

10. The substrate processing apparatus according to claim 9, wherein the controller executes the draining step corresponding to the next chemical liquid supplying step in parallel with the next chemical liquid supplying step from the start of the next chemical liquid supplying step, if the period required for execution of the last draining step does not reach the predetermined second period at an end of the last draining step.

* * * * *